United States Patent
Jung et al.

(10) Patent No.: US 9,922,921 B2
(45) Date of Patent: Mar. 20, 2018

(54) TAPE WIRING SUBSTRATE, SEMICONDUCTOR PACKAGE, AND DISPLAY APPARATUS INCLUDING SEMICONDUCTOR PACKAGE

(71) Applicants: Jae-min Jung, Seoul (KR); Na-rae Shin, Yongin-si (KR)

(72) Inventors: Jae-min Jung, Seoul (KR); Na-rae Shin, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 294 days.

(21) Appl. No.: 14/637,385

(22) Filed: Mar. 3, 2015

(65) Prior Publication Data

US 2015/0311148 A1    Oct. 29, 2015

(30) Foreign Application Priority Data

Apr. 24, 2014    (KR) ........................ 10-2014-0049462

(51) Int. Cl.
*H05K 7/00* (2006.01)
*H05K 1/18* (2006.01)
(Continued)

(52) U.S. Cl.
CPC .... *H01L 23/49838* (2013.01); *H01L 23/4985* (2013.01); *H05K 1/189* (2013.01);
(Continued)

(58) Field of Classification Search
CPC ............ H01L 2224/50; H01L 2224/79; H01L 2224/86; H01L 2225/06579; H01L 2225/107; H01L 23/49572; H01L 24/50; G02F 1/13452; G02F 2001/13456; G02F 1/13458; G09G 2300/0408; G09G 2290/00; H05K 2201/05; H05K 2201/10681; H05K 2201/10689; H05K 2201/10674;
(Continued)

(56) References Cited

U.S. PATENT DOCUMENTS 7,948,768 B2    5/2011    Park et al.
8,154,120 B2    4/2012    Kang et al.
(Continued)

FOREIGN PATENT DOCUMENTS

JP    2005079303 A    3/2005
KR    20070039732 A    4/2007
(Continued)

*Primary Examiner* — Binh Tran
(74) *Attorney, Agent, or Firm* — Renaissance IP Law Group LLP

(57) ABSTRACT

A semiconductor package includes: a semiconductor chip including an effective chip region at a center of the semiconductor chip and in which pads connected to chip wirings are formed, and a dummy chip region at a side of the effective chip region and in which pads not connected to the chip wirings are formed; a base film including a chip mounting section on which the semiconductor chip is mounted; and a plurality of wiring patterns disposed on the base film and electrically connected to the chip wirings of the semiconductor chip, wherein first wiring patterns, which are a part of the plurality of wiring patterns, extend on a first region of the chip mounting section corresponding to the dummy chip region.

20 Claims, 19 Drawing Sheets

(51) Int. Cl.
*H01L 23/498* (2006.01)
*H05K 1/00* (2006.01)
*H01L 23/48* (2006.01)
*H01L 23/49* (2006.01)
*H01L 23/00* (2006.01)

(52) U.S. Cl.
CPC ....... *H01L 23/49811* (2013.01); *H01L 23/564* (2013.01); *H01L 2224/16225* (2013.01); *H05K 2201/09781* (2013.01); *H05K 2201/10128* (2013.01); *H05K 2201/10681* (2013.01)

(58) Field of Classification Search
CPC ......... H05K 2201/10159; H05K 1/111; H05K 1/116; H05K 1/117
USPC ....... 361/748, 749, 760, 761, 764, 767, 768, 361/772, 777, 783, 784, 789; 174/254, 174/527, 534, 557; 349/149–152
See application file for complete search history.

(56) References Cited

U.S. PATENT DOCUMENTS

| | | | |
|---|---|---|---|
| 8,198,722 B2 | 6/2012 | Cho et al. | |
| 2009/0231823 A1* | 9/2009 | Kunimatsu | H05K 1/111 361/783 |
| 2010/0038117 A1* | 2/2010 | Chung | H01L 23/4985 174/254 |
| 2012/0306529 A1* | 12/2012 | Omori | G01R 31/048 324/763.01 |
| 2013/0077005 A1* | 3/2013 | Kim | G02F 1/13452 349/40 |

FOREIGN PATENT DOCUMENTS

| | | |
|---|---|---|
| KR | 20100045076 | 5/2010 |
| KR | 20110065695 A | 6/2011 |

* cited by examiner

TAPE WIRING SUBSTRATE, SEMICONDUCTOR PACKAGE, AND DISPLAY APPARATUS INCLUDING SEMICONDUCTOR PACKAGE

CROSS-REFERENCE TO RELATED APPLICATIONS

This application claims the benefit of Korean Patent Application No. 10-2014-0049462, filed on Apr. 24, 2014, in the Korean Intellectual Property Office, the disclosure of which is incorporated herein in its entirety by reference.

BACKGROUND

Embodiments relate to a semiconductor package, and more particularly, to a tape wiring substrate, a semiconductor package including the tape wiring substrate, and a display apparatus including the semiconductor package.

Recently, electronic appliances have become smaller, thinner, and lighter. In order to cope with such trends, chip-on-film (COF) package technology using a flexible film substrate has been proposed as high-density semiconductor chip package technology. According to the COF package technology, a semiconductor chip is directly bonded to a film substrate by flip-chip bonding and is connected to an external circuit by short leads, and dense wiring patterns are formed. Therefore, the COF package technology has been considered as high-density package technology. The COF package may be applied to portable terminals, such as cellular phones or personal digital assistants (PDAs), panels of laptop computers or display apparatuses, and the like.

SUMMARY

An embodiment includes a semiconductor package includes: a semiconductor chip including an effective chip region at a center of the semiconductor chip and in which pads connected to chip wirings are formed, and a dummy chip region at a side of the effective chip region and in which pads not connected to the chip wirings are formed; a base film including a chip mounting section on which the semiconductor chip is mounted; and a plurality of wiring patterns disposed on the base film and electrically connected to the chip wirings of the semiconductor chip, wherein first wiring patterns, which are a part of the plurality of wiring patterns, extend on a first region of the chip mounting section corresponding to the dummy chip region.

An embodiment includes a tape wiring substrate comprising: a base film including a chip mounting section on which a semiconductor chip is to be mounted; and a plurality of wiring patterns provided on the base film, wherein some of the plurality of wiring patterns extend on a portion of the chip mounting section.

An embodiment includes a semiconductor package comprising: a semiconductor chip including an effective chip region in which effective pads connected to chip wirings are formed, and a dummy chip region at both sides of the effective chip region and in which dummy pads not connected to the chip wirings are formed; a base film on which the semiconductor chip is mounted, the base film including: a chip mounting section having an effective mounting region corresponding to the effective chip region and a dummy mounting region corresponding to the dummy chip region, a wiring section disposed at an outside of the chip mounting section, a perforation section which is on both sides of the wiring section and in which perforation holes are formed at regular intervals, and a bonding section that is bonded to an external device; and a plurality of wiring patterns electrically connected to the chip wirings of the semiconductor chip and wirings of the external device and formed in the dummy mounting region and the wiring section.

An embodiment includes a display apparatus comprising: a display panel that configured to displays an image; a printed circuit board that configured to supplies driving signals for driving the display panel to display the image; and a flexible semiconductor package which is connected between the printed circuit board and the display panel and on which a semiconductor chip is mounted, wherein the flexible semiconductor package includes the semiconductor chip with a heat dissipation region, a base film with a chip mounting section on which the semiconductor chip is mounted, and a plurality of wiring patterns formed on the base film and electrically connected to the semiconductor chip, and first wiring patterns, which are a part of the plurality of wiring patterns, extend on the chip mounting section overlapping the heat dissipation region.

An embodiment includes a semiconductor package, comprising: a semiconductor chip including an effective chip region at a center of the semiconductor chip and in which pads connected to chip wirings are formed, and a dummy chip region at a side of the effective chip region and in which pads not connected to the chip wirings are formed; a base film including a chip mounting section on which the semiconductor chip is mounted; and a plurality of wiring patterns disposed on the base film and electrically connected to the chip wirings of the semiconductor chip, wherein a first wiring pattern of the wiring patterns is electrically connected to at least one of the pads in the effective chip region and at least one of the pads in the dummy chip region.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
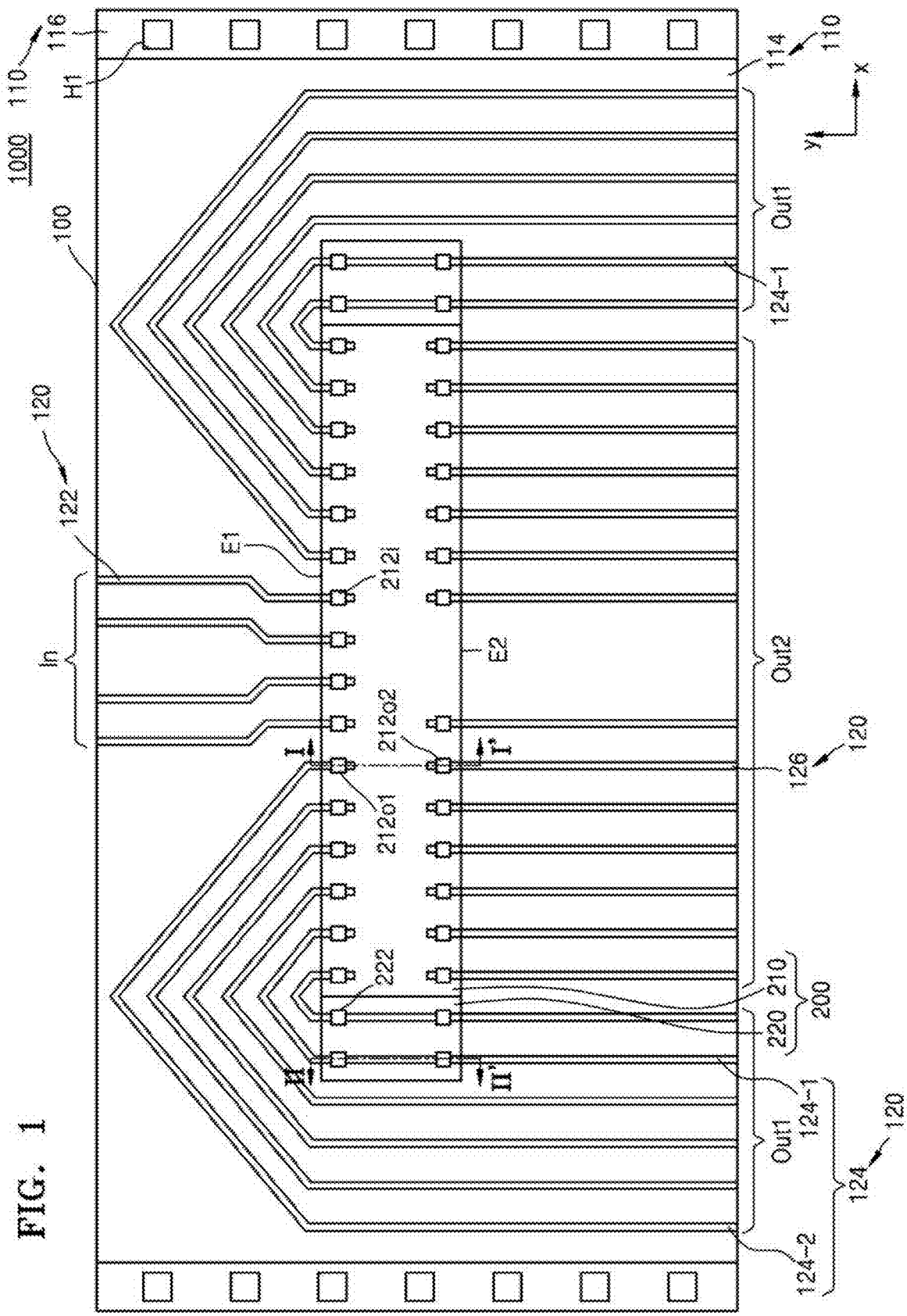
FIG. 1 is a plan view of a configuration of a semiconductor package according to an embodiment.

Embodiments will be described with reference to the accompanying drawings. Embodiments may, however, take many different forms and should not be construed as being limited to the particular embodiments set forth herein; rather, these embodiments are provided so that this disclosure will be thorough and complete, and will fully convey the concept to those of ordinary skill in the art. As used herein, the term "and/or" includes any and all combinations of one or more of the associated listed items. Expressions such as "at least one of" when preceding a list of elements, modify the entire list of elements and do not modify the individual elements of the list.

It will be understood that when an element, such as a layer, a region, or a substrate, is referred to as being "on" or "connected to" another element, it may be directly on, connected or coupled to the other element or intervening elements may be present. In the drawings, the dimensions of structures are exaggerated for clarity. Parts having no relation to the description are omitted. Like reference numerals denote like elements throughout the specification and drawings.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view of a configuration of a semiconductor package 1000 according to an embodiment. Referring to FIG. 1, the semiconductor package 1000 may include a tape wiring substrate 100 and a semiconductor chip 200. The tape wiring substrate 100 may include a base film 110 having an insulating property, and multiple conductive wiring patterns 120.

The base film 110 may be a flexible film made of polyimide that is excellent in terms of coefficient of thermal expansion (CTE) and durability. However, the material of the base film 110 is not limited to polyimide. For example, the base film 110 may be made of synthetic resin, such as epoxy-based resin, acrylic resin, polyether nitrile resin, polyether sulfone resin, polyethylene terephthalate resin, or polyethylene naphthalate resin.

The base film 110 may include a chip mounting section (112 of FIG. 3), a wiring section 114, and a perforation (PF) section 116. The chip mounting section 112 may be a portion on which the semiconductor chip 200 is mounted. The wiring section 114 may be a portion in which wiring patterns 120 connected to the semiconductor chip 200 are arranged. The PF section 116 may be disposed at both sides, with the wiring section 114 as the center, and may include multiple PF holes H1. The PF holes H1 may make it possible to control reeling of the base film 110 around a winding reel (not illustrated) or releasing of the base film 110 from the winding reel (not illustrated).

Since a pitch of the PF holes H1 is generally constant, a length of the tape wiring substrate 100 may be determined by the number of PF holes H1. For example, the tape wiring substrate 100 according to the present embodiment may be a 7PF product having seven PF holes H1. On the other hand, a width of the tape wiring substrate 100 may be determined by a width of the semiconductor chip 200 to be mounted and the number of wiring patterns to be arranged.

In FIG. 1, the semiconductor package 100 is schematically illustrated. Thus, a panel bonding section and a printed circuit board (PCB) bonding section on the base film 110 are omitted in FIG. 1. However, the base film 110 may include a panel bonding section bonded to a display panel (not illustrated) at a lower side and a PCB bonding section bonded to a PCB at an upper side.

The wiring patterns 120 may be formed on the base film 110 and include a conductive material, such as a metal material. For example, the wiring patterns 120 may be made of copper (Cu). However, the material of the wiring patterns 120 is not limited to copper. In order to protect the wiring patterns 120, the wiring patterns 120 may be covered with a protection film such as solder resist.

Figure 7:
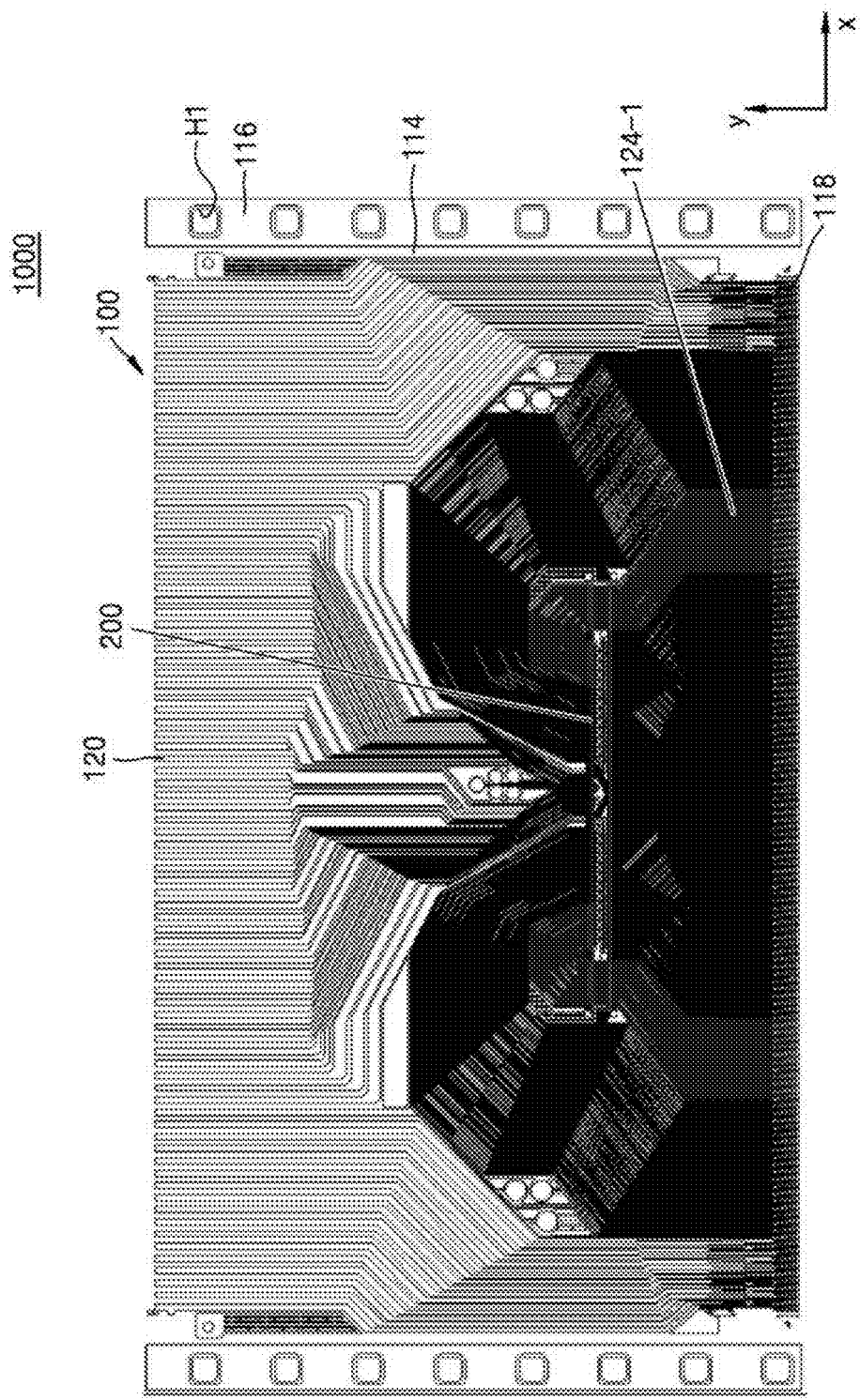
FIG. 7 is a plan view of a practical configuration of a semiconductor package according to an embodiment.

The wiring patterns 120 may include input wiring patterns 122, first output wiring patterns 124, and second output wiring patterns 126. Although not illustrated in FIG. 1, the wiring patterns 120 may include bypass wiring patterns that are not connected to the semiconductor chip 200 as illustrated in FIG. 7. Furthermore, in FIG. 1, the input wiring patterns 122, the first output wiring patterns 124, and the second output wiring patterns 126 are denoted with In, Out1, and Out2, respectively, so as to distinguish the wiring patterns 120 from one another.

The input wiring patterns 122 may be paths through which signal voltages are transferred from the PCB to the semiconductor chip 200. Only four input wiring patterns 122 are illustrated, but this is only for easy understanding and any number of input wiring patterns 122 may be present. For example, several tens to several hundreds of input wiring patterns 122 may be provided. The input wiring patterns 122 may be electrically connected to input pads 212$i$ of the semiconductor chip 200.

The first and second output wiring patterns 124 and 126 may be paths through which signals are transferred from the semiconductor chip 200 to data lines of another component. For example, the other component may be a display panel and the transferred signals may be image signals. The first output wiring patterns 124 may be paths that start from first output pads 212$o$1 disposed along a first long edge E1 of the semiconductor chip 200 in a first direction (x direction) and extend to a lower portion of the base film 110 corresponding to the panel bonding section. In addition, the second output wiring patterns 126 may be paths that start from second output pads 212$o$2 disposed along a second long edge E2 of the semiconductor chip 200 in the first direction (x direction) and extend to the lower portion of the base film 110.

As illustrated in FIG. 1, since there are no obstacles between the second long edge E2 of the semiconductor chip 200 and the lower portion of the base film 110, the second output wiring patterns 126 may have a structure that extends downward in a substantially straight-line form. However, in the case of the first output wiring patterns 124, the semiconductor chip 200 and the second output wiring patterns 126 may act as obstacles. That is, if the first output wiring patterns 124 directly extend toward the lower portion of the base film 110, the first output wiring patterns 124 may overlap the second output wiring patterns 126 or connection terminals on the second output pads 212$o$2 disposed along the second long edge E2 of the semiconductor chip 200 in the first direction (x direction).

As a result, in order to prevent the above problem, the first output wiring patterns 124 may extend in a structure that extends such obstacles as illustrated in FIG. 1. The structure of the first output wiring patterns 124 may be a structure in which the first output wiring patterns 124 start from the first long edge E1 toward the upper portion of the base film 110, are bent three times in a right direction (first output wiring patterns 124 on the right side) or in a left direction (first output wiring patterns 124 on the left side), and extend toward the lower portion of the base film 110. However, the structure of the first output wiring patterns 124 is not limited to the above example and the structure of the first output wiring patterns 124 may take other forms. For example, the first output wiring patterns 124 may be bent four times or more and extend toward the lower portion of the base film 110, or may extend toward the lower portion of the base film 110 while turning in a curve shape.

In an embodiment, the first output wiring patterns 124 may be divided into first wiring patterns 124-1 that intersect with the outer side of the semiconductor chip 200 and extend toward the lower portion of the base film 110, and second wiring patterns 124-2 that do not intersect with the semiconductor chip 200 and extend toward the lower portion of the base film 110 through the base film 110 outside of the semiconductor chip 200. The semiconductor chip 200 may be divided into an effective chip region 210 at the center and dummy chip regions 220 disposed at both sides of the effective chip region 210. Pads, which perform a signal input/output function in practice, may not exist in the dummy chip regions 220. Therefore, since the second output wiring patterns 126 do not exist between the dummy chip region 220 and the lower portion of the base film 110, the dummy chip regions 220 may be used as the paths of the first wiring patterns 124-1 that are a part of the first output wiring patterns 124.

As described above, since a portion (112d of FIG. 3) of the chip mounting region of the base film 110 corresponding to the dummy chip region 220 of the semiconductor chip 200 is used as the paths of some of the first output wiring patterns 124, the semiconductor package 1000 according to the present embodiment may remarkably reduce the width of the tape wiring substrate 100, as compared with the package structure in which all the first output wiring patterns 124 adopt the paths outside of the semiconductor chip 200. For example, the semiconductor package 1000 an embodiment may solve a problem of needing to increase the width of the tape wiring substrate 100 by the widths of the dummy chip regions 220 at both sides of the semiconductor chip 200. Therefore, it is possible to use the tape wiring substrate 100 on which an existing semiconductor chip without dummy chip regions 220 may have been applied with the semiconductor chip 200 having an increased width due to the addition of the dummy chip regions 220.

As illustrated, the first wiring patterns 124-1 may extend on the dummy mounting regions (112d of FIG. 3) of the chip mounting region of the base film 110 such that the first wiring patterns 124-1 are connected to pads of the dummy chip regions 220, that is, dummy terminals (224 of FIG. 6) on dummy pads 222. In addition, the dummy pads 222 are disposed at edges adjacent to the first long edge E1 and the second long edge E2. As illustrated, each of the first wiring patterns 124-1 may extend toward the lower portion of the base film 110 and be commonly connected to the dummy terminal (224 of FIG. 6) on one dummy pad 222 at the upper edge of the dummy chip region 220 and the dummy terminal (224 of FIG. 4) on one dummy pad 222 at the lower edge of the dummy chip region 220. As a result, each of the first wiring patterns 124-1 may be connected to a connection terminal (214 of FIG. 5a) on one first output pad 212o1 of the effective chip region 210 and dummy terminals 224 of two dummy pads 222.

In other embodiments, the arrangement structure of the dummy pads 222 or the connection relationship between the dummy pads 222 and the first wiring patterns 124-1 is not limited to the above example. For example, the dummy pads 222 may be arranged in various structures, and accordingly, the connection relationship between the dummy pads 222 and the first wiring patterns 124-1 may be variously changed. A detailed description thereof will be given below with reference to FIGS. 10 to 17.

The semiconductor chip 200 may be any variety of semiconductor devices. For example, the semiconductor chip 200 may be a source driver integrated circuit (IC) configured to receive a signal voltage from the PCB, generate an image signal, and output the image signal through data lines of a display panel. In addition, the semiconductor chip 200 may be a gate driver IC that generates a scan signal including a transistor on/off signal and outputs the scan signal through gate lines of the display panel. However, the semiconductor chip 200 is not limited to being a source driver IC or a gate driver IC. For example, when the semiconductor package 1000 according to an embodiment is used by being connected to an electronic device other than the display device, the semiconductor chip 200 may be an IC for driving that electronic device.

The semiconductor chip 200 may be mounted on the chip mounting section (112 of FIG. 3) of the base film 110 by flip-chip bonding. In other words, the connection terminals, such as bumps or solder balls, are disposed on input and output pads exposed on an active surface of the semiconductor chip 200 and are directly connected to the wiring patterns physically and electrically. Hence, the semiconductor chip 200 may be mounted on the tape wiring substrate 100. Although not illustrated, the semiconductor chip 200 may be sealed by a sealant such as, for example, epoxy resin, so as to protect the semiconductor chip 200 from a physical and chemical damage from the outside. In addition, an underfill may be filled between the semiconductor chip 200 and the tape wiring substrate 100. Although a particular mounting technique has been described, other mounting techniques may be used.

As described above, the semiconductor chip 200 may include the effective chip region 210 and the dummy chip regions 220. In the effective chip region 210, internal ICs may be formed and a plurality of input and output pads, for example, the input pads 212i, the first output pads 212o1, and the second output pads 212o2, may be disposed along the first long edge E1 and the second long edge E2 in the first direction (x direction). Specifically, the input pads 212i may be disposed at the center of the first long edge E1 of the effective chip region 210, and the first output pads 212o1 may be disposed along the first long edge E1 at both sides of the input pads 212i. In contrast, the second output pads 212o2 may be disposed along the second long edge E2 of the effective chip region 210.

The second output pads 212o2 may be disposed along the second long edge E2 in almost the entire region of the second long edge E2. However, if necessary, the second output pads 212o2 may not be disposed at the center of the second long edge E2. For example, power input pads (not illustrated) may be disposed at the center of the second long edge E2. In this case, the second output pads 212o2 may be disposed at both sides of the second long edge E2.

Although not illustrated, chip wirings (230 of FIG. 8) may be formed in the effective chip region 210, and the chip wirings may electrically connect internal ICs to the input and output pads. In FIG. 1, the ends of the wiring patterns 120 are illustrated as protruding from the input and output pads 212i, 212o1 and 212o2, but the connection structure of the wiring patterns 120 and the input and output pads 212i, 212o1 and 212o2 is not limited thereto. For example, the ends of the wiring pads 120 may not protrude from the input and output pads 212i, 212o1 and 212o2.

In an embodiment, the input and output pads 212i, 212o1 and 212o2 and some of the wiring patterns 120 are illustrated on the semiconductor chip 200, but this is only for ease of understanding. That is, since the input and output pads 212i, 212o1 and 212o2 are disposed on the bottom surface of the semiconductor chip 200 and some of the wiring patterns 120 are disposed on the chip mounting section (112 of FIG. 3) of the base film 110, they may be covered by the semiconductor chip 200 and thus be obscured. However, since the base film 110 is transparent, the bottom surface of the semiconductor chip 200 may be seen through the transparent base film 110 when the semiconductor package 1000 is turned over. In addition, as can be seen from FIGS. 5A to 6, the input and output pads 212i, 212o1 and 212o2 and the wiring patterns 120 may be connected through the connection terminals 214. Therefore, instead of the input and output pads 212i, 212o1 and 212o2, the connection terminals 214, such as bumps, may be seen.

The dummy chip regions 220 may be at both sides of the effective chip region 210. The dummy chip regions 220 may be regions that are additionally formed for heat dissipation. Hence, unlike the effective chip region 210, no internal ICs or chip wirings may be formed in the dummy chip regions 220.

In an embodiment, the dummy pads 222 may be formed in the dummy chip regions 220. The dummy pads 222 may be disposed at the edges towards ends of the first long edge E1 and the second long edge E2 in the first direction (x direction). In FIG. 1, two dummy pads 222 are disposed at each edge, but this is only for easy understanding and any number of dummy pads 222 may be present. In practice, several tens to several hundreds of dummy pads 222 may be provided in the dummy chip regions 220. As described above, since no chip wirings are formed in the dummy chip regions 220, the dummy pads 222 may not be connected to the chip wirings.

Figure 6:
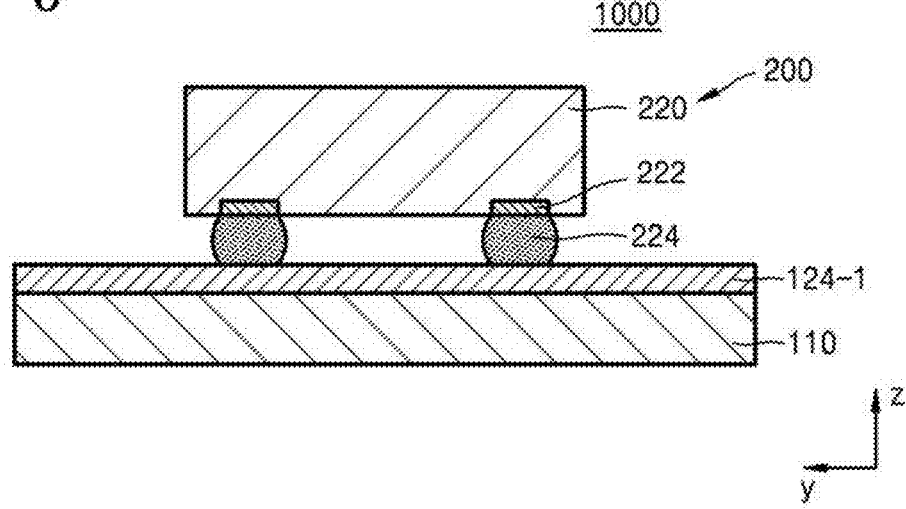
FIG. 6 is a cross-sectional view taken along line II-II' of FIG. 1.

As can be seen from FIG. 6, the dummy terminals 224 may be formed on the dummy pads 222, respectively. When the semiconductor chip 200 is mounted on the chip mounting section 112 of the tape wiring substrate 100, the dummy pads 222 and the dummy terminals 224 may contribute to tight bonding with the tape wiring substrate 100. On the other hand, the size and pitch of the dummy pads 222 may be equal to or different from the size and pitch of the first output pads 212o1 of the effective chip region 210. A detailed description thereof will be given below with reference to FIGS. 10 to 17.

As described above, the first wiring patterns 124-1 may be connected to the dummy terminals (224 of FIG. 6) on the dummy pads 222 of the dummy chip regions 220. Specifically, each of the first wiring patterns 124-1 may be connected to two dummy terminals 224. In addition, each of the first wiring patterns 124-1 may be connected to one dummy terminal 224, or at least some of the first wiring patterns 124-1 may not be connected to the dummy terminals 224. For example, some first wiring patterns 124-1 may extend between dummy pads 222 or other pads 212. The first wiring patterns 124-1, which are not connected to the dummy terminals 224, may simply extend across the chip mounting section (112 of FIG. 3) of the base film 110.

In the semiconductor package 1000 according to an embodiment, the chip mounting section corresponding to the dummy chip regions 220 on the tape wiring substrate 100 may be used as the paths of the wiring patterns. Therefore, the semiconductor package 1000 may reduce the width of the tape wiring substrate 100, as compared with the package structure in which the paths of the first output wiring patterns 124 are all provided at the outside of the lateral sides of the semiconductor chip 200. That is, the semiconductor package 1000 may solve a problem of needing to expand the width of the tape wiring substrate 100 by the widths of the dummy chip regions 220 at both sides of the semiconductor chip 200. In addition, it is possible to use the tape wiring substrate 100 on which the an semiconductor chip without dummy chip regions 220 may be used, while instead using the semiconductor chip 200 having an increased width due to the addition of the dummy chip regions 220.

Figure 2:
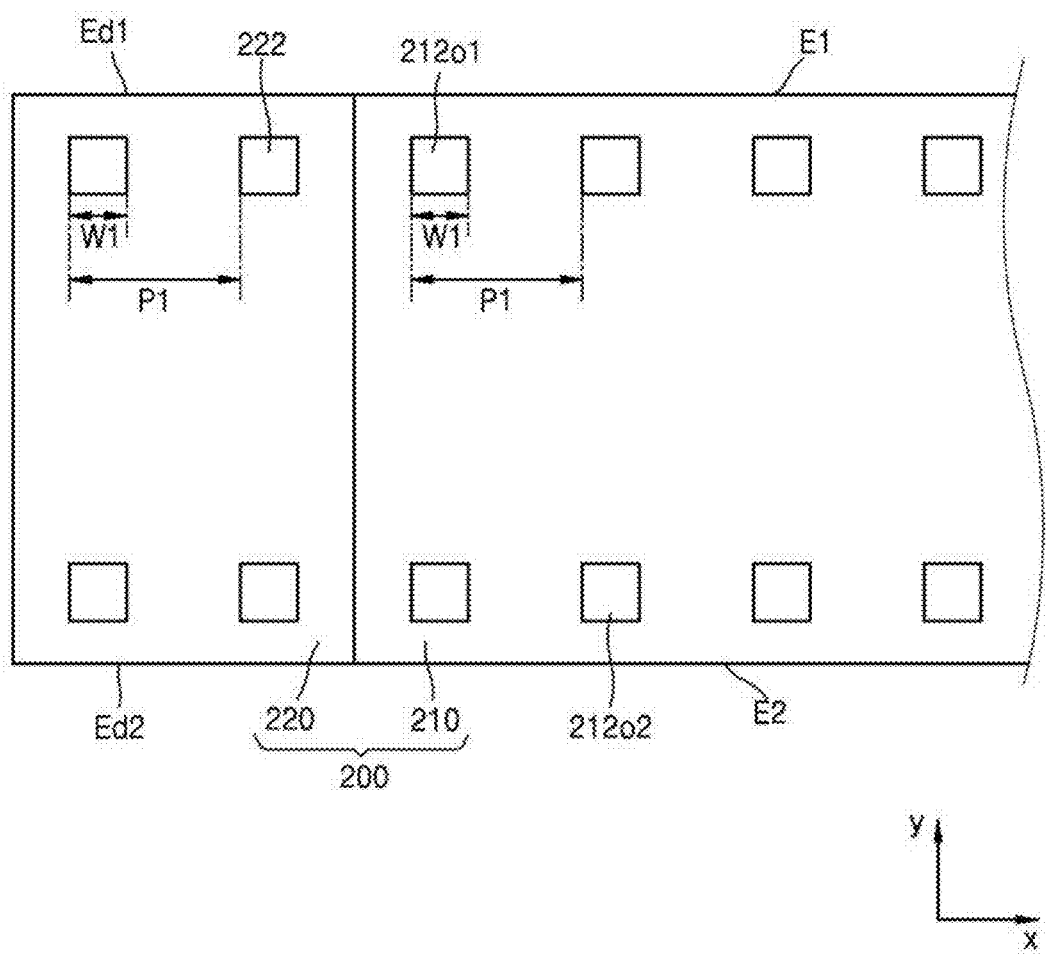
FIG. 2 is an enlarged plan view of a portion of a semiconductor chip in the semiconductor package of FIG. 1.

FIG. 2 is an enlarged plan view of a portion of the semiconductor chip 200 in the semiconductor package 1000 of FIG. 1. For convenience, the descriptions provided above with reference to FIG. 1 may be omitted for clarity.

Referring to FIG. 2, the semiconductor chip 200 may include the effective chip region 210 and the dummy chip regions 220. The input and output pads 212i, 212o1 and 212o2 may be disposed in the effective chip region 210. In particular, the first output pads 212o1 may be disposed at the first long edge E1 adjacent to the dummy chip region 220, and the second output pads 212o2 may be disposed at the second long edge E2.

Specifically, the first output pads 212o1 may be disposed with a first width W1 and a first pitch P1 on the first long edge E1 in the first direction (x direction). For example, each of the first width W1 and the first pitch P1 may be several tens of μm to several hundreds of μm. The first pitch P1 may be equal to or less than twice the first width W1. However, in some cases, the first pitch P1 may be more than twice the first width W1. In the semiconductor package 1000 according to an embodiment, the first width W1 of the first output pads 212o1 may be about 15 μm and the first pitch P1 of the first output pads 212o1 may be about 25 μm. However, the width and the pitch of the first output pads 212o1 are not limited thereto.

The second output pads 212o2 also may be disposed with the first width W1 and the first pitch P1 on the second long edge E2 in the first direction (x direction). However, the second output pads 212o2 may be disposed with a different width and pitch than those of the first output pads 212o1. In addition, even when the second output pads 212o2 are disposed with the same width and pitch as those of the first output pads 212o1, the positions of the second output pads 212o2 in the first direction (x direction) may be different from those of the first output pads 212o1.

In an embodiment, the dummy pads 222 may be disposed in the dummy chip regions 220. Like the first output pads 212o1, the dummy pads 222 may be disposed with the first width W1 and the first pitch P1. In addition, the positions of the dummy pads 222 of a first dummy long edge Ed1 adjacent to the first long edge E1 in the first direction (x direction) may be substantially the same as the positions of the dummy pads 222 of a second dummy long edge Ed2 adjacent to the second long edge E2 in the first direction (x direction). Therefore, as illustrated in FIG. 1, each of the first wiring patterns 124-1 may be connected to one first output pad 212o1 and two dummy pads 222. However, the positions of the dummy pads 222 are not limited thereto and may be variously changed. A detailed description thereof will be described below with reference to FIGS. 10 to 17.

Figure 3:
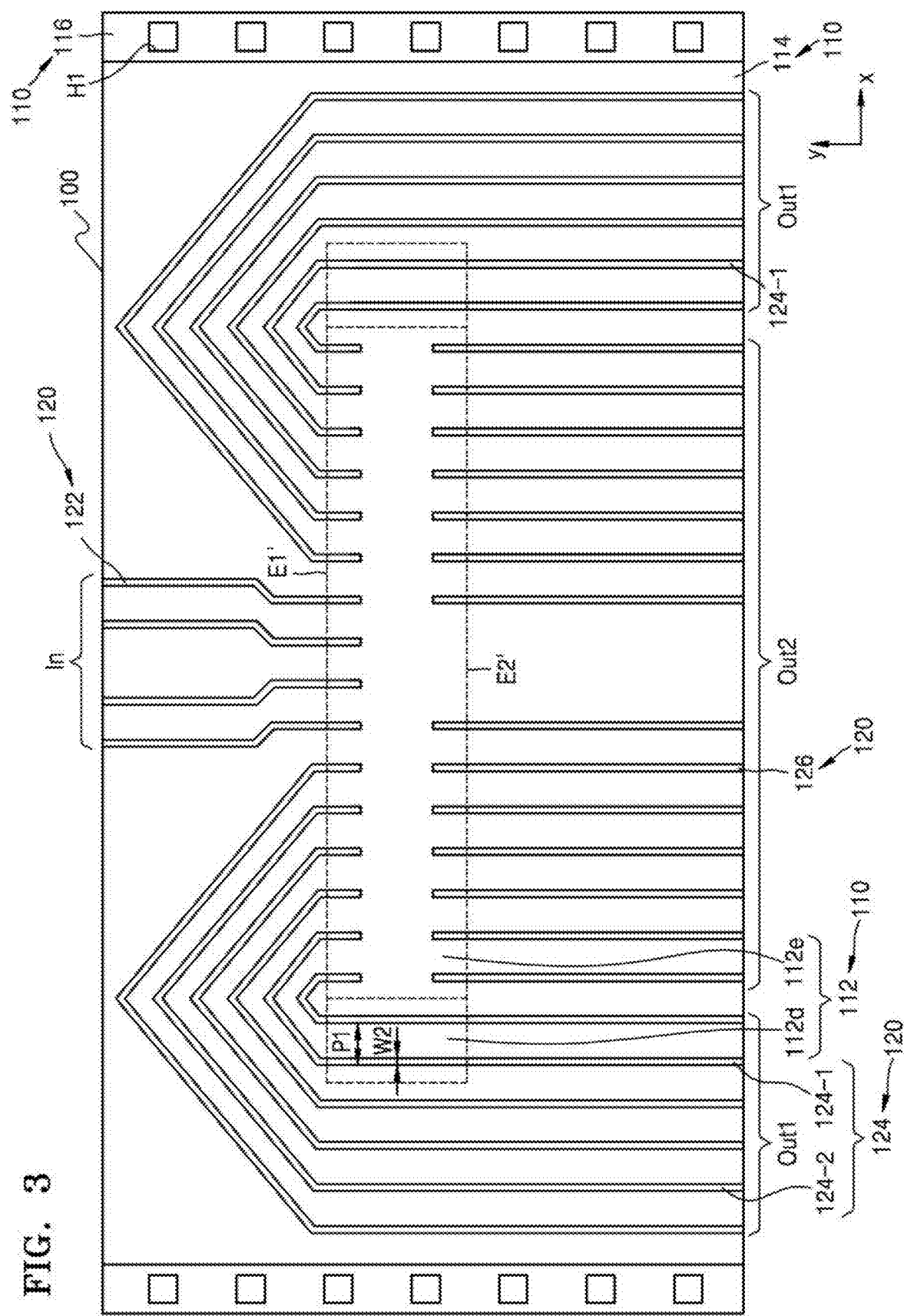
FIG. 3 is a plan view of a tape wiring substrate with no semiconductor chip mounted thereon in the semiconductor package of FIG. 1.

FIG. 3 is a plan view of the tape wiring substrate 100 with no semiconductor chip mounted thereon in the semiconductor package 1000 of FIG. 1. For convenience, the descriptions provided above with reference to FIG. 1 may be omitted for clarity.

Referring to FIG. 3, the tape wiring substrate 100 may include the base film 110 and the wiring patterns 120. The base film 110 may include the chip mounting section 112, the wiring section 114, and the PF section 116. The chip mounting section 112 is indicated by a dashed line, and the semiconductor chip 200 may be mounted on the chip mounting section 112, such as by flip-chip bonding. The chip mounting section 112 may be divided into an effective mounting region 112e and a dummy mounting region 112d, which correspond to the effective chip region 210 and the dummy chip region 220 of the semiconductor chip 200, respectively.

The first wiring patterns 124-1 may extend on the dummy mounting region 112d. The pitch of the first wiring patterns 124-1 may be substantially equal to the pitch of the above-described dummy pads 222. For example, the first wiring patterns 124-1 may have the first pitch P1. The first wiring patterns 124-1 may have a second width W2. The second width W2 of the first wiring patterns 124-1 may be equal to the first width W1 of the dummy pads 222, or may be greater than or less than the first width W1. However, in order to mutually connect the first wiring patterns 124-1 and the dummy pads 222, the pitch of the first wiring patterns 124-1 may be substantially equal to the pitch of the dummy pads 222 as described above.

For reference, the wiring patterns 120 may be formed thinly at connection portions between the wiring patterns 120 and the input and output pads 212i, 211o1, and 212o2 of the semiconductor chip 200 because the wiring patterns 120 are limited by the width and the pitch of the input and output pads 212i, 212o1 and 212o2. However, in the case of the input wiring patterns 122 of FIG. 1, the wiring patterns 120 disposed away from the semiconductor chip 200 may have a greater width and pitch than those of the input and output pads 212i, 212o1 and 212o2. For example, the wiring patterns 120 disposed away from the semiconductor chip 200 may have a width of about 20 μm and a pitch of about 35 μm. However, the width and the pitch of the wiring patterns 120 are not limited the above numerical values. For example, the width and the pitch of the wiring patterns 120 may be less or greater than the above numerical values. In some cases, the wiring patterns 120 may be disposed with various widths and pitches.

In an embodiment, in the effective mounting region 112e, the input wiring patterns 122 and the output wiring patterns 124 may extend towards a first effective long edge E1' corresponding to the first long edge E1, and the second output wiring patterns 126 may extend towards a second effective long edge E2' corresponding to the second long edge E2. However, the wiring patterns 120 may not be disposed on the base film 110 to extend between the first effective long edge E1' and the second effective long edge E2 of the effective mounting region 112e. If power input pads are formed at the second long edge E2 of the semiconductor chip 200, wiring patterns connected to the power input pads may be disposed on the base film 110 between the first effective long edge E1' and the second effective long edge E2'.

Figure 4:
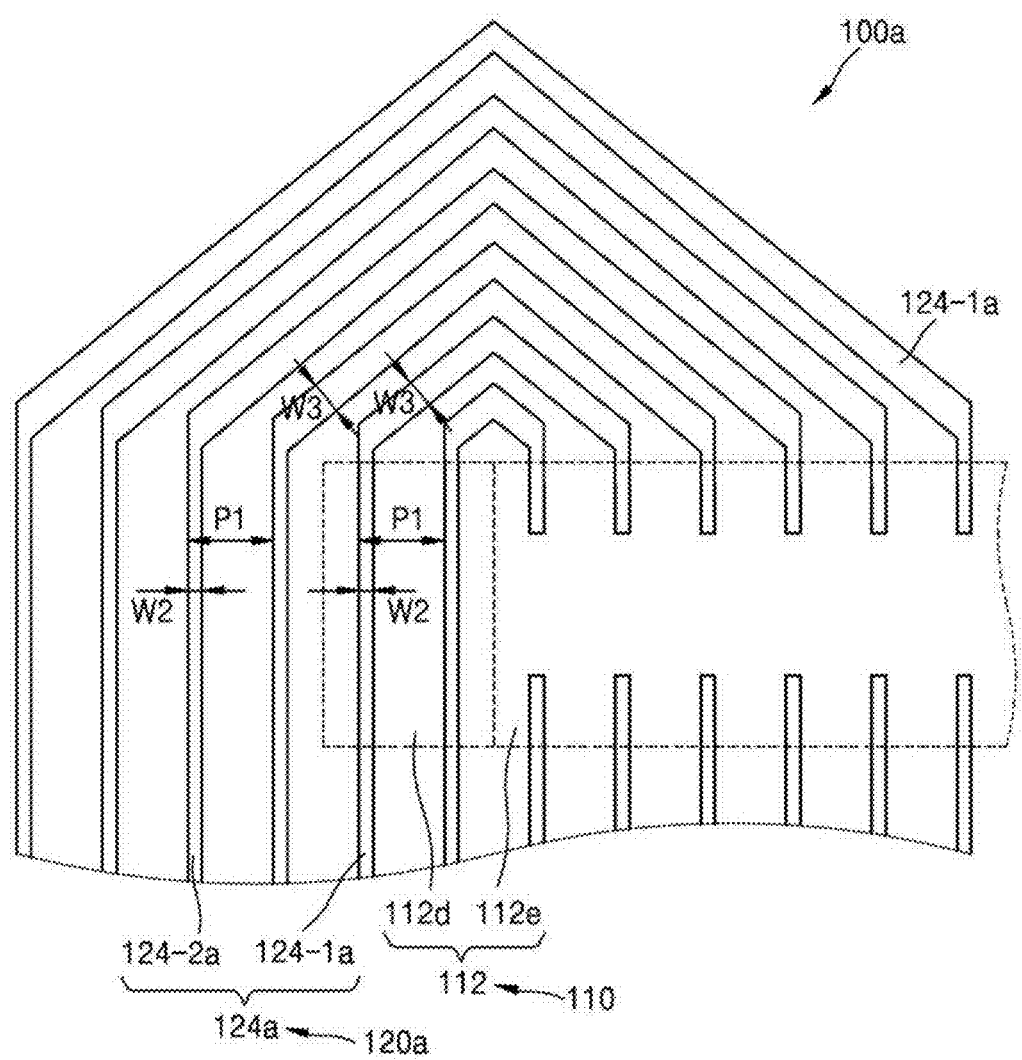
FIG. 4 is a plan view of a modification of the tape wiring substrate of FIG. 3.

FIG. 4 is a plan view of a tape wiring substrate 100a as a modification of the tape wiring substrate 100 of FIG. 3. For convenience, the descriptions provided above with reference to FIGS. 1 and 3 may be omitted for clarity. Referring to FIG. 4, the tape wiring substrate 100a according to an embodiment is similar to the tape wiring substrate 100 of FIG. 3, except for the structure of first output wiring patterns 124a. For easy understanding, only first output wiring patterns 124a are illustrated in FIG. 4 in more detail.

Specifically, in the tape wiring substrate 100a according to an embodiment, first wiring patterns 124-1a have different widths in a dummy mounting region 112d and a region outside of the chip mounting section 112. For example, the first wiring patterns 124-1a have a second width W2 in the dummy mounting region 112d and a third width W3 in the region outside of the chip mounting section 112. The third width W3 may be greater than the second width W2. Generally, an extra space exists outside the chip mounting section 112. Therefore, wiring patterns may be formed with a larger width and a larger pitch in the outside of the chip mounting section 112.

Second wiring patterns 124-2a may extend on the outside of the chip mounting section 112. Due to the limitation to the width of the tape wiring substrate 100a, the space for the base film 110 may be insufficient beyond the lateral sides of the chip mounting section 112. Therefore, for the second wiring patterns 124-2a, the width beyond the lateral sides of the chip mounting section 112 may be smaller than the width beyond the upper edge of the chip mounting section 112.

In an embodiment, the first wiring patterns 124-1a disposed in the dummy mounting region 112d and the second wiring patterns 124-2a disposed at the outside of the lateral sides of the chip mounting section 112 may have the first pitch P1. In addition, the pitch of the first wiring patterns 124-1a and the second wiring patterns 124-2a disposed at the outside of the upper edge of the chip mounting section 112 may be greater than or equal to the first pitch P1.

Figure 5A:
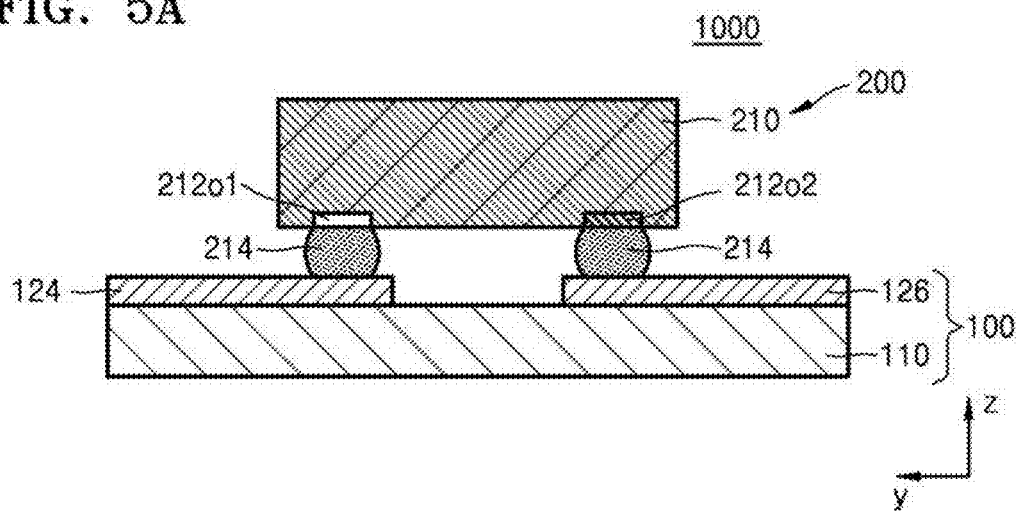
FIGS. 5A and 5B are cross-sectional views taken along line I-I' of FIG. 1.
Figure 5B:
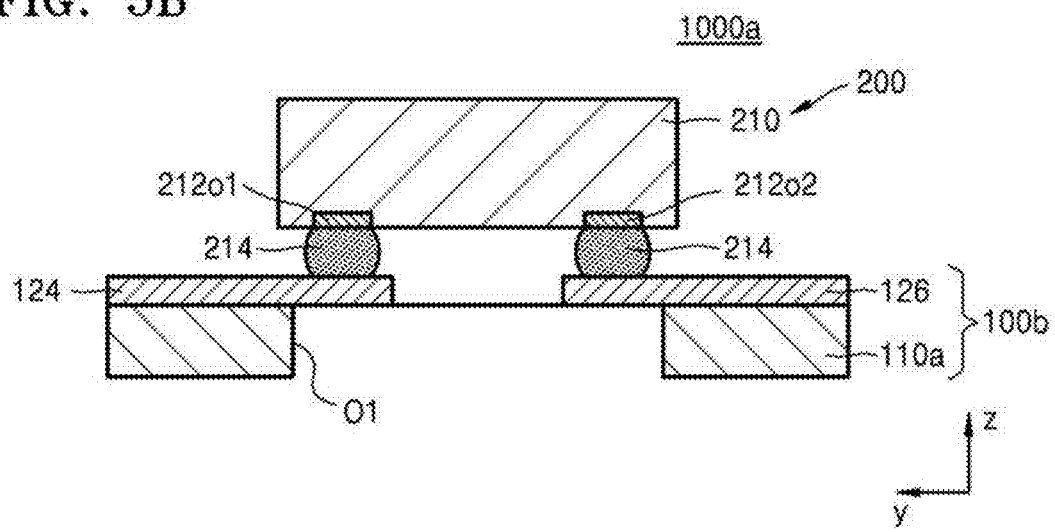

FIGS. 5A and 5B are cross-sectional views taken along line I-I' of FIG. 1. For example, the descriptions provided above with reference to FIG. 1 may be omitted for clarity. Referring to FIG. 5A, the first and second output wiring patterns 124 and 126 may be disposed on the base film 110. Specifically, the first output wiring patterns 124 and the second output wiring patterns 126 may be formed at both sides of the chip mounting section (112 of FIG. 3), in which the semiconductor chip 200 is to be mounted, and extend in the second direction (y direction). Since the first output wiring patterns 124 and the second output wiring patterns 126 are different output wirings, the first output wiring patterns 124 and the second output wiring patterns 126 may be electrically separated and insulated from one another.

On the other hand, since the I-I' cut-out portion of FIG. 1 corresponds to the effective chip region 210, the cut-out surface of the semiconductor chip 200 illustrated in FIG. 5a may correspond to the effective chip region 210. In addition, a portion of the base film 110 under the semiconductor chip 200 may correspond to the effective mounting region 112e of the chip mounting section 112.

The semiconductor chip 200 may be mounted on the chip mounting section 112 of the base film 110 through the connection terminals 214 by flip-chip bonding. In this manner, the first output pads 212o1 may be electrically connected to the first output wiring patterns 124 through the connection terminals 214, respectively, and the second output pads 212o2 may be electrically connected to the second output wiring patterns 126 through the connection terminals 214, respectively.

Although not illustrated, the lateral sides and the top surface of the semiconductor chip 200 may be covered with a sealant, such as epoxy resin, so as to protect the semiconductor chip 200. In addition, an underfill may be filled between the semiconductor chip 200 and the tape wiring substrate 100. The wiring patterns disposed at the outside of the semiconductor chip 200 may be covered with a protection film.

Referring to FIG. 5B, a semiconductor package 1000a according to another embodiment is similar to the semiconductor package 1000 of FIG. 5A, except that a tape carrier 100b is used instead of the tape wiring substrate 100. A base film 110a of the tape carrier 100b may be thicker than the base film 110 used in the tape wiring substrate 100. As illustrated in FIG. 5B, an opening O1 may be formed in a portion where the semiconductor chip 200 is to be mounted. In addition, slit holes may be formed so that the base film 110a is smoothly bent.

First and second output wiring patterns 124 and 126 may be formed on the base film 110a of the tape carrier 100b, and the semiconductor chip 200 may be mounted by flip-chip bonding and be electrically connected to the first and second output wiring patterns 124 and 126. In an embodiment, the semiconductor chip 200 is mounted on top surfaces of the first and second output wiring patterns 124 and 126 in a third direction (z direction), but the semiconductor chip 200 may be mounted on bottom surfaces of the first and second output wiring patterns 124 and 126 by forming a wider opening O1 and receiving the semiconductor chip 200 in the opening O1.

FIG. 6 is a cross-sectional view taken along line II-II' of FIG. 1. For convenience, the descriptions provided above with reference to FIG. 1 may be omitted for clarity. Referring to FIG. 6, first wiring patterns 124-1 among the first output wiring patterns 124 may be disposed on the base film 110. The first wiring patterns 124-1 may extend in the second direction (y direction) while passing through the dummy mounting region (112d of FIG. 3) of the chip mounting section 112 in which the semiconductor chip 200 is to be mounted. Since the II-II' cut-out region of FIG. 1 corresponds to the dummy chip regions 220, the cut-out surface of the semiconductor chip 200 illustrated in FIG. 6 may correspond to the dummy chip region 220, and a portion of the base film 110 under the semiconductor chip 200 may correspond to the dummy mounting section 112d of the chip mounting section 112.

The dummy pads 222 and the dummy terminals 224 may be disposed in the dummy chip regions 220. As described above, no chip wirings may be formed in the dummy chip regions 220, and the dummy pads 222 and the dummy terminals 224 may not be connected to the chip wirings. Therefore, the dummy pads 222 and the dummy terminals 224 may perform no circuit function in the semiconductor chip 200. That is, no electric signals may be transferred to the first wiring patterns 124-1 through the dummy pads 222 and the dummy terminals 224.

In an embodiment, since the semiconductor chip 200 is connected to the tape wiring substrate 100 by using the dummy pads 222 and the dummy terminals 224 by flip-chip bonding, the dummy pads 222 and the dummy terminals 224 may reinforce and maintain a physical bonding force between the semiconductor chip 200 and the tape wiring substrate 100.

As described above with reference to FIG. 5A, a sealant, an underfill, and a protection film may be formed. In addition, the tape carrier 100b may be applied instead of the tape wiring substrate 100.

FIG. 7 is a plan view of a practical configuration of a semiconductor package 1000 according to an embodiment.

Referring to FIG. 7, the semiconductor package 1000 according to an embodiment may include a tape wiring substrate 100 and a semiconductor chip 200. The tape wiring substrate 100 may include a base film 110 and wiring patterns 120. Since the base film 110 of the tape wiring substrate 100 and the semiconductor chip 200 have been described above in detail with reference to FIGS. 1 and 2, a repeated description thereof will be omitted.

The structure or connection relationship of the wiring patterns 120 may be basically similar to those of the wiring patterns 120 described above with reference to FIG. 1. However, as illustrated in FIG. 7, the number of wiring patterns 120 may be significantly greater than the number of wiring patterns 120 illustrated in FIG. 1. In addition, all the wiring patterns 120 disposed in the upper portion of the tape wiring substrate 100 in the second direction (y direction) may not be connected to the semiconductor chip 200. For example, the wiring patterns 120 disposed in the upper portion of the tape wiring substrate 100 may include bypass wiring patterns that are directly connected to the display panel without being connected to the semiconductor chip 200 and the input wiring patterns 122 connected to the semiconductor chip 200.

On the other hand, some of the input wiring patterns 122 may be power input wiring patterns (212i2 of FIG. 8) that are not connected to input pads 212i on a first long edge E1 of the semiconductor chip 200 and are connected to input pads on a second long edge E2. The power input wiring patterns may transfer power signals to the semiconductor chip 200. In addition, the power input wiring patterns may extend on the effective mounting region (112e of FIG. 3) and be electrically connected to the input pads disposed on the second long edge E2.

In the semiconductor package 1000 according to an embodiment, the first wiring patterns 124-1 extending on the dummy mounting region (112d of FIG. 3) are indicated by a gray color. For convenience, only two first wiring patterns 124-1 are illustrated in FIG. 1, but it can be seen from FIG. 7 that several tens to several hundreds of first wiring patterns 124-1 may be disposed. In addition, it can be seen that the first wiring patterns 124-1 extend on the dummy mounting region 112d and extend toward the lower portion of the base film 110.

As indicated in FIG. 7, a part of the lower portion of the base film 110 may correspond to a panel bonding section 118, and some of the wiring patterns 120 disposed in the upper portion of the base film 110 may correspond to a PCB bonding section. In addition, ends of the wiring patterns 120 disposed in the upper portion of the base film 110 may be removed by cutting.

As described above, since the first wiring patterns 124-1 are disposed to extend on the dummy mounting region 112d, the width of the tape wiring substrate 100 may be reduced by the width of the dummy mounting regions 112d or the total width of the first wiring patterns 124-1, thereby contributing to a reduction in the size of the semiconductor package 1000. In addition, it is possible to utilize a tape wiring substrate having a width on which a semiconductor chip without dummy chip regions 220 may be applied.

Figure 8:
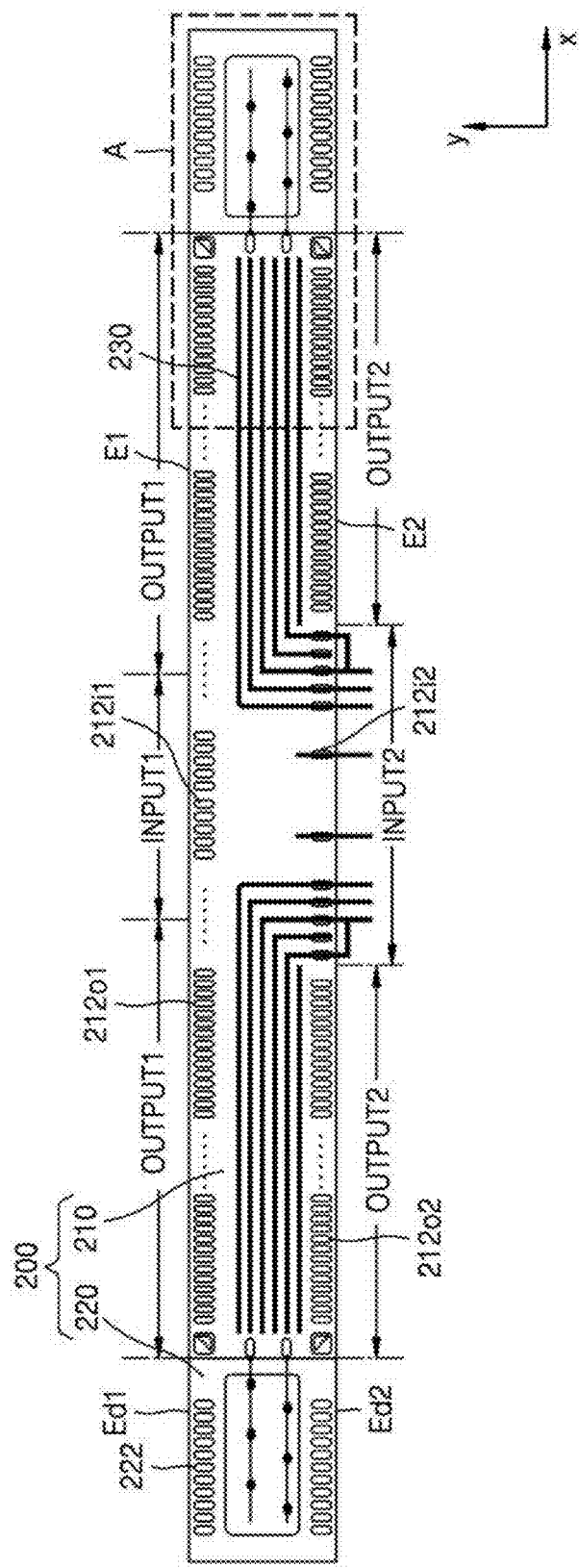
FIG. 8 is a plan view of a configuration of a semiconductor chip in a semiconductor package, according to an embodiment.

FIG. 8 is a plan view of a configuration of a semiconductor chip 200 in a semiconductor package, according to an embodiment. For convenience, the descriptions provided above with reference to FIGS. 1 and 2 may be omitted for clarity. Referring to FIG. 8, the semiconductor chip 200 may include an effective chip region 210 and dummy chip regions 220. First input pads 212i1, second input pads 212i2, first output pads 212o1, and second output pads 212o2 may be disposed in the effective chip region 210. The first input pads 212i1, the second input pads 212i2, the first output pads 212o1, and the second output pads 212o2 are separately indicated by INPUT1, INPUT2, OUTPUT1, and OUTPUT2, respectively.

Since the first input pads 212i1, the first output pads 212o1, and the second output pads 212o2 have been described above with reference to FIG. 1, a repeated description thereof will be omitted. The second input pads 212i2 are pads for power signal input and may be disposed at the center of the second long edge E2. The second input pads 212i2 may be connected to input wiring patterns extending while passing in or through the effective mounting region 112e of the chip mounting section 112.

As illustrated in FIG. 8, chip wirings 230 may be formed in the effective chip region 210. The chip wirings 230 may be connected to the second input pads 212i2, respectively, and power signals may be transferred therethrough. A plurality of chip wirings, which are connected through the first input pads 212i1, the first output pads 212o1, and the second output pads 212o2, may be formed in the semiconductor chip 200.

Dummy pads 222 may be disposed in the dummy chip regions 220. The dummy pads 222 may be disposed at a first dummy long edge Ed1 adjacent to the first long edge E1 and a second dummy long edge Ed2 adjacent to the second long edge E2 in the first direction (x direction). As described above, the dummy chip regions 220 may be regions that are additionally formed at both sides of the effective chip region 210 for heat dissipation. The dummy chip regions 220 may perform no circuit function. Since the dummy chip regions 220 perform no circuit function, no chip wirings may be formed, or some chip wirings may be formed as illustrated in FIG. 8. In this manner, the wiring density of the effective chip region 210 may be similar to the wiring density of the dummy chip region 220 with respect to a semiconductor chip manufacturing process. Therefore, it is possible to facilitate the manufacturing process and prevent the generation of stress caused by a density difference between regions. On the other hand, since the chip wirings formed in the dummy chip regions 220 perform no circuit function, the chip wirings may not be connected to the dummy pads 222.

The size or pitch of the dummy pads 222 disposed in the dummy chip regions 220 may be substantially equal to the size or pitch of the input and output pads disposed in the effective chip region 210. Like the chip wirings, the pad density may be similarly maintained. In addition, all the dummy pads 222 may be connected to the wiring patterns through dummy terminals, thus reinforcing the bonding force between the semiconductor chip 200 and the tape wiring substrate 100.

The size or pitch of the dummy pads 222 disposed in the dummy chip regions 220 may be different from the size or pitch of the input and output pads disposed in the effective chip region 210. For example, the size or pitch of the dummy pads 222 disposed in the dummy chip regions 220 may be greater than the size or pitch of the input and output pads disposed in the effective chip region 210. If the size or pitch of the input and output pads disposed in the effective chip region 210 is very small and thus the input and output pads are also formed with the same size and pitch in the dummy chip regions 220, it may be disadvantageous in terms of process difficulty, time, and cost. Therefore, the above problems may be solved by forming the dummy pads 222 with a relatively large size and pitch in the dummy chip regions 220. Since the main object of the dummy pads 222 formed in the dummy chip regions 220 is to reinforce the bonding force between the semiconductor chip 200 and the tape wiring substrate 100, the size or pitch of the dummy pads 222 disposed in the dummy chip regions 220 may be determined by considering a minimum bonding force required between the semiconductor chip 200 and the tape wiring substrate 100.

Figure 9:
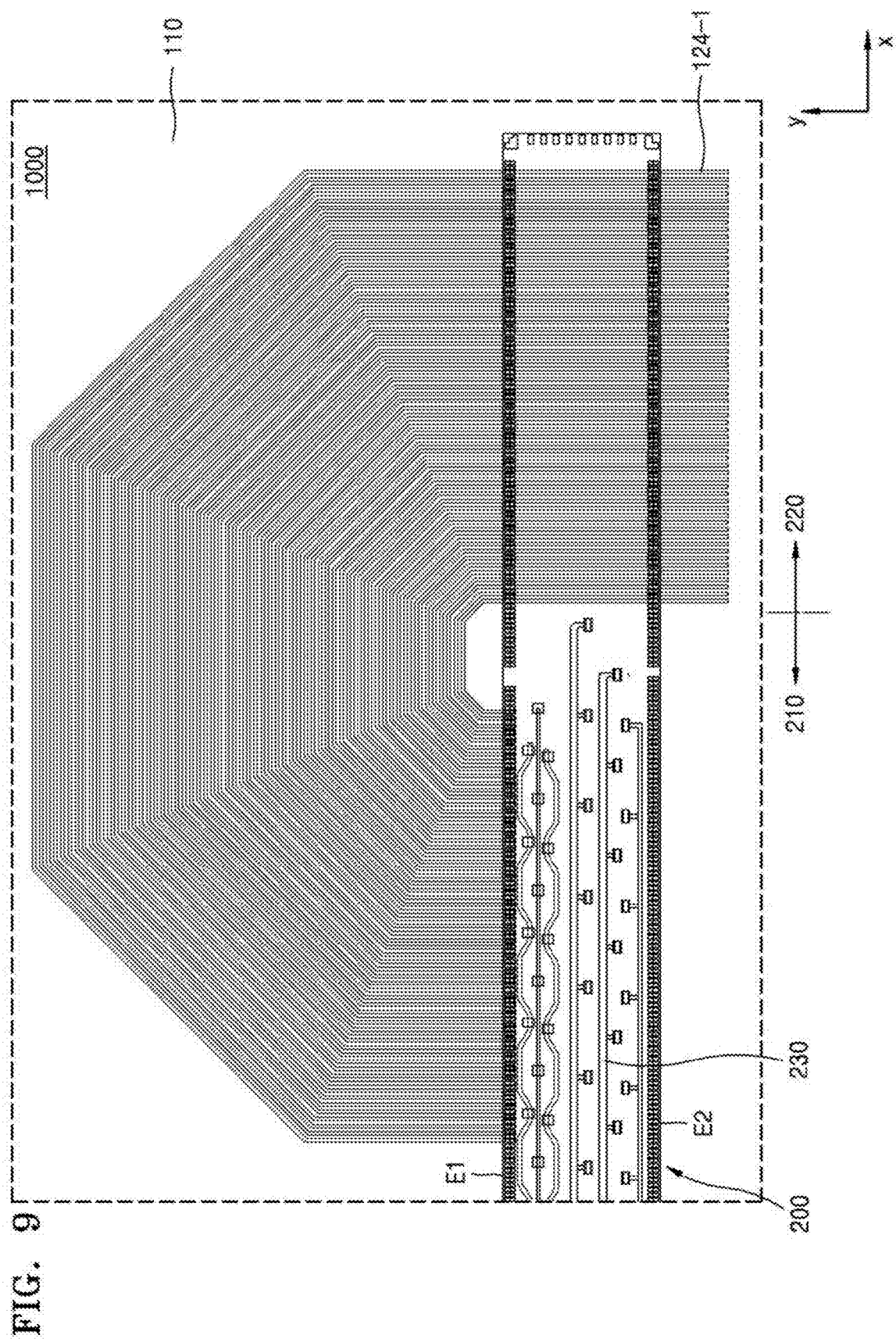
FIG. 9 is a plan view of a wiring pattern structure in a dummy chip region of the semiconductor chip of FIG. 8.

FIG. 9 is a plan view of the wiring pattern structure in the dummy chip regions 220 of the semiconductor chip 200 of FIG. 8. Specifically, FIG. 9 illustrates the portion A of FIG. 8 and the tape wiring substrate 100 disposed in a lower portion thereof. Referring to FIG. 9, the effective chip region 210 and the dummy chip regions 220 at the right end of the semiconductor chip 200 are illustrated. In the effective chip region 210, the chip wirings 230 are arranged to extend in the first direction (x direction). The first wiring patterns 124-1 may start upward from the first long edge E1 of the effective chip region 210 and extend in the second direction (y direction) by bending four times clockwise. As illustrated in FIG. 9, the first wiring patterns 124-1 may be disposed to extend on the dummy mounting region (112d of FIG. 3) corresponding to the dummy chip region 220.

If the first wiring patterns 124-1 extend on the base film 110 disposed at the outside of the end of the semiconductor chip 200, that is, the end of the dummy chip region 220, the tape wiring substrate 100, the width of which is increased as much, may be needed. That is, if the semiconductor chip 200 including the dummy chip regions 220 is mounted on the tape wiring substrate 100 in the existing method, the width of the base film 110 needs to be increased by the width of the dummy chip regions 220 at both sides of the base film 110. The increase in the width of the base film 110 may be unsuitable because it may increase the size and cost of the semiconductor package 1000. However, the semiconductor package 1000 according to an embodiment may reduce or eliminate the increase in the width of the base film 110 by using the dummy mounting region 112d disposed in the lower portion of the dummy chip region 220 as the paths of the first wiring patterns 124-1. Therefore, it is possible to use the base film 110 on which the semiconductor chip 200 without dummy chip regions 220 may be applied, thereby solving the increase in the size or cost of the semiconductor package 1000.

FIGS. 10 to 17 are conceptual diagrams of the pad arrangement structure in a dummy chip region of a semiconductor chip and the connection relationship between pads and wiring patterns, according to various embodiments.

Figure 10:
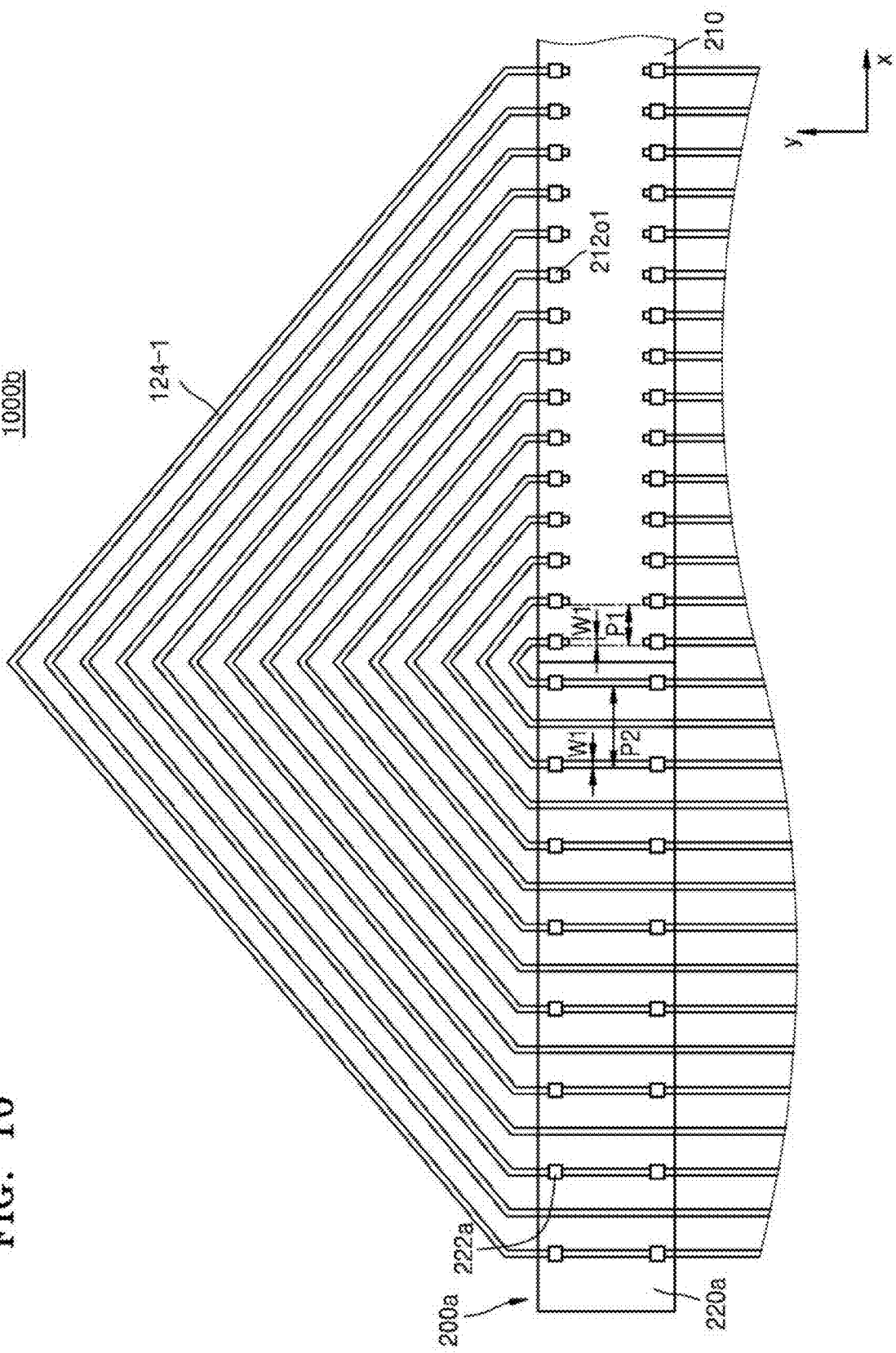
FIGS. 10 to 17 are conceptual diagrams of a pad arrangement structure in a dummy chip region of a semiconductor chip and a connection relationship between pads and wiring patterns, according to various embodiments.

Referring to FIG. 10, in a semiconductor package 1000b according to an embodiment, the arrangement structure of dummy pads 222a of a dummy chip region 220a may be different from the arrangement structure of the semiconductor package 1000 of FIG. 1. Specifically, in the semiconductor package 1000b according to the present embodiment, the dummy pads 222a may have a first width W1 and a second pitch P2. The second pitch P2 may be twice the first pitch P1. In an embodiment, the first output pads 212o1 of the effective chip region 210 may have the first width W1 and the first pitch P1 as in the first semiconductor package 1000 of FIG. 1.

Since the pitch of the dummy pads 222a of the dummy chip region 220a is twice the pitch of the first output pads 212o1 of the effective chip region 210, one of two first wiring patterns 124-1 starting from the first output pads 212o1 and extending on the dummy mounting region may meet the dummy pads 222a and the other may pass between the dummy pads 222a without meeting the dummy pads 222a.

In the semiconductor package 1000b according to an embodiment, the pitch of the dummy pads 222a is set to be twice the pitch of the first output pads 212o1, but the pitch of the dummy pads 222a is not limited thereto. For example, the pitch of the dummy pads 222a may be equal to or more than triple the pitch of the first output pads 212o1. However, as described above, regarding the increase in the pitch of the dummy pads 222a, it is necessary to consider the minimum bonding force between the semiconductor chip 200 and the tape wiring substrate 100. In an embodiment, the width of the dummy pads 222a also is not limited to the first width W1 and may be increased.

Figure 11:
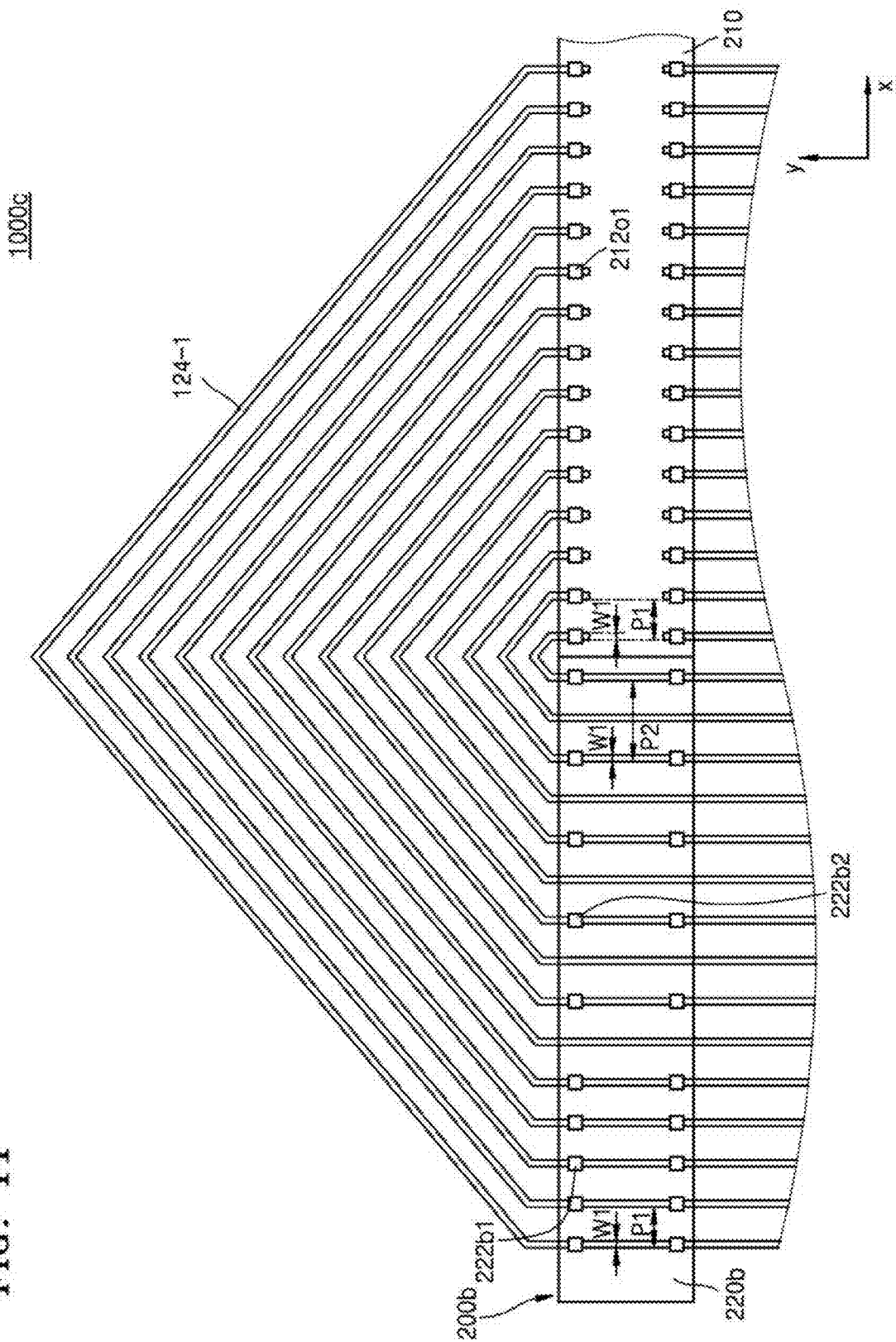

Referring to FIG. 11, in a semiconductor package 1000c according to an embodiment, the arrangement structure of dummy pads 222b1 and 222b2 of a dummy chip region 220b may be different from the arrangement structure of the semiconductor package 1000 of FIG. 1. Specifically, in the semiconductor package 1000c according to an embodiment, the dummy pads may be classified into two types. For example, the dummy pads may be classified into first dummy pads 222b1 having the first width W1 and the first pitch P1 and the second dummy pads 222b2 having the first width W1 and the second pitch P2. The second pitch P2 may be twice the first pitch P1. In an embodiment, the first output pads 212o1 of the effective chip region 210 may have the first width W1 and the first pitch P1 as in the first semiconductor package 1000 of FIG. 1.

Since the dummy pads 222b1 and 222b2 are disposed on the dummy chip region 220b as described above, all the first dummy pads 222b1 may meet the first wiring patterns 124-1, respectively, and the second dummy pads 222b2 may meet every second first wiring patterns 124-1 as in the semiconductor package 1000b of FIG. 10.

Since the dummy pads 222b1 and 222b2 are densely disposed at the outer lateral side of the dummy chip region 220b, the bonding force between the semiconductor chip 200 and the tape wiring substrate 100 at the outer side of the semiconductor chip 200 may be reinforced. Generally, considering that the bonding force is weak at the outer side of the semiconductor chip 200 in the flip-chip bonding structure of the semiconductor chip 200, the problem of weak bonding force may be reduced if not eliminated by densely providing the dummy pads at the outer side of the dummy chip region 220b.

Figure 12:
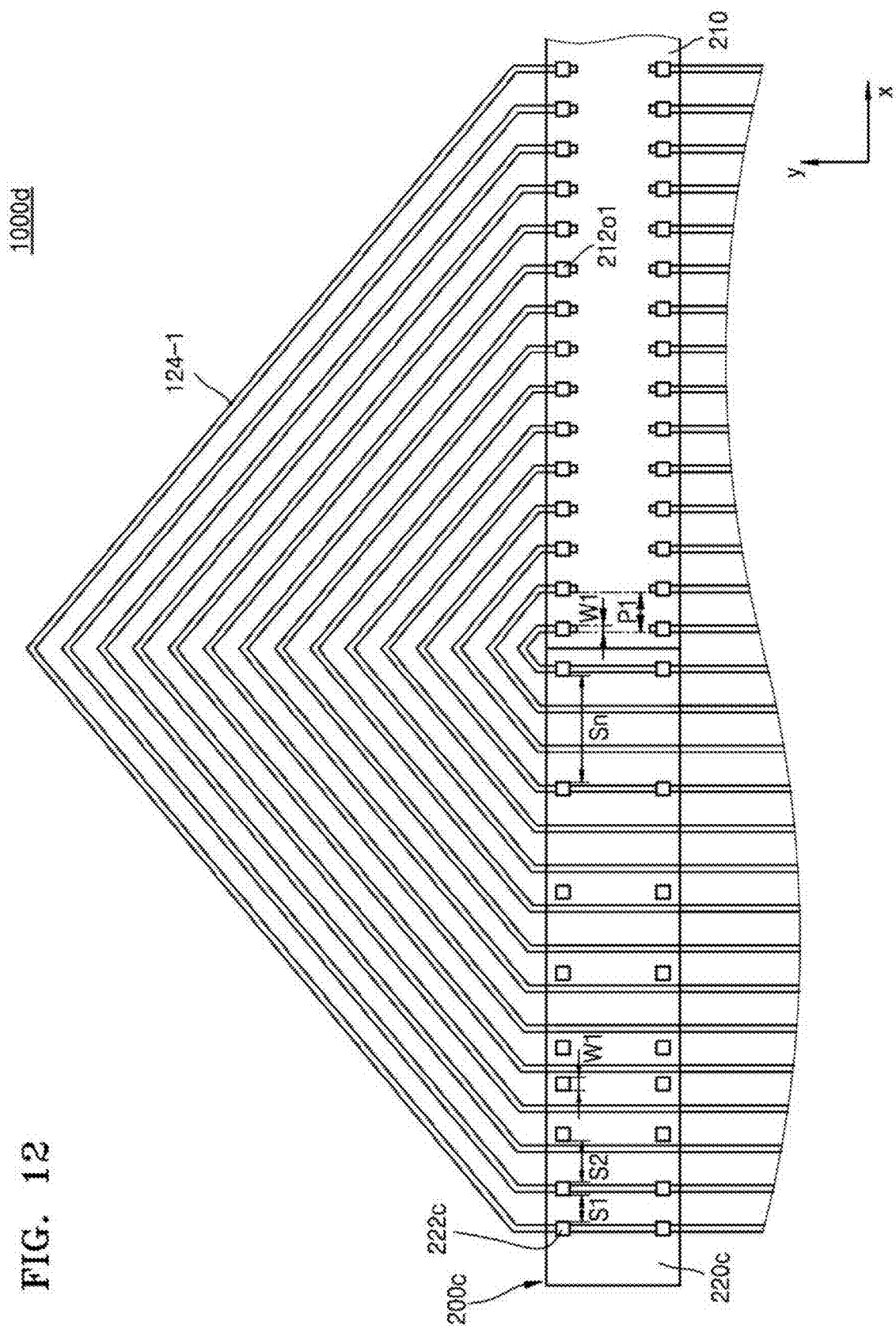

Referring to FIG. 12, in a semiconductor package 1000d according to the present embodiment, the arrangement structure of dummy pads 222c of a dummy chip region 220c may be different from the arrangement structure of the semiconductor package 1000 of FIG. 1. Specifically, in the semiconductor package 1000d according to the present embodiment, the dummy pads 222c may be disposed narrower toward the outer side. For example, the dummy pads 222c may have a first width W1 and a first spacing S1 at the outermost side and may have the first width W1 and an n-th spacing Sn at a portion close to the effective chip region 210. The n-th spacing Sn may be equal to or more than twice the first spacing S1. For reference, since the pitch is defined when the pads have a constant width and a constant spacing, the pitch may not be defined in the arrangement structure of the dummy pads 222c according to an embodiment.

In an embodiment, the first output pads 212o1 of the effective chip region 210 may have the first width W1 and the first pitch P1 as in the first semiconductor package 1000 of FIG. 1. Therefore, the first wiring patterns 124-1 starting from the first output pads 212o1 may or may not meet the dummy pads 222c. In addition, some of the dummy pads 222c may not meet the first wiring patterns 124-1.

However, considering that the bonding force is reinforced by connecting the dummy pads 222c and the first wiring patterns 124-1 through the dummy terminals 224 and connecting the dummy pads 222c, the first wiring patterns 124-1, and the dummy terminals 224 as metal, the dummy pads 222c may be disposed to meet the first wiring patterns 124-1. Therefore, the spacing of the dummy pads 222c may be gradually increased in association with the first pitch P1 or may be increased according to a constant regulation.

Figure 13:
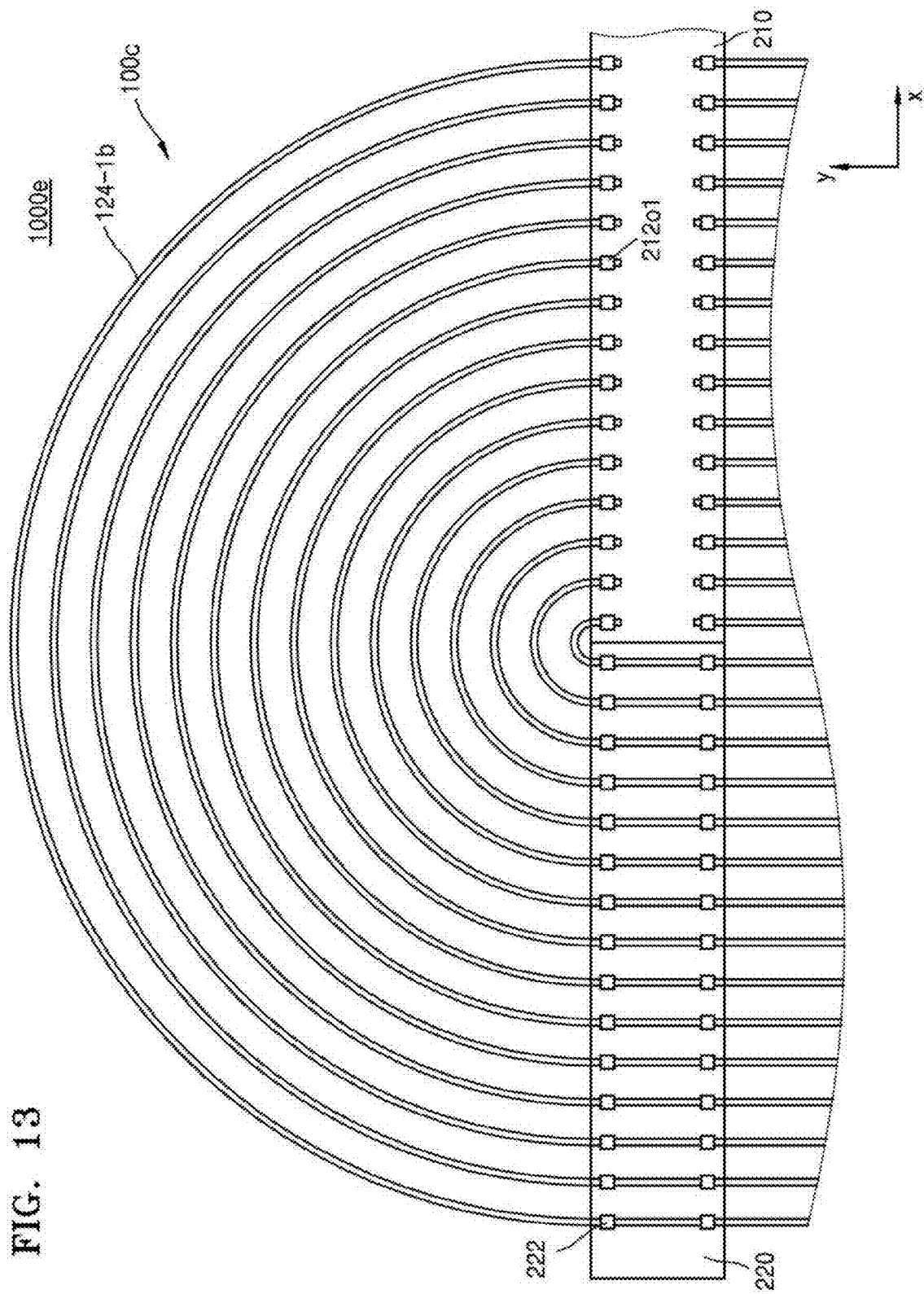

Referring to FIG. 13, in a semiconductor package 1000e according to the present embodiment, the structure of first wiring patterns 124-1b of a tape wiring substrate 100c may be different from the structure of the semiconductor package 1000 of FIG. 1. Specifically, the first wiring patterns 124-1b may start from the first output pads 212o1, turn counterclockwise in a curve shape, and extend downward in the second direction (y direction), as well as extend on the dummy mounting region (112d of FIG. 3). In addition, the first wiring patterns 124-1b disposed on the right side of the semiconductor chip 200 may start from the first output pads 212o1, turn clockwise in a curve shape, and extend downward in the second direction (y direction), as well as extend on the dummy mounting region 112d. The curve shape may be a semicircular shape, a semielliptic shape, or any soft curve shape.

Although not illustrated, the second wiring patterns (124-2 of FIG. 1), except for the first wiring patterns 124-1b among the first output wiring patterns, may start from the first output pads 212o1, turn clockwise or counterclockwise, and extend downward in the second direction (y direction). The second wiring patterns 124-2 may not extend on the dummy mounting region 112d and extend on the base film (110 of FIG. 1) outside of the chip mounting region 112.

Figure 14:
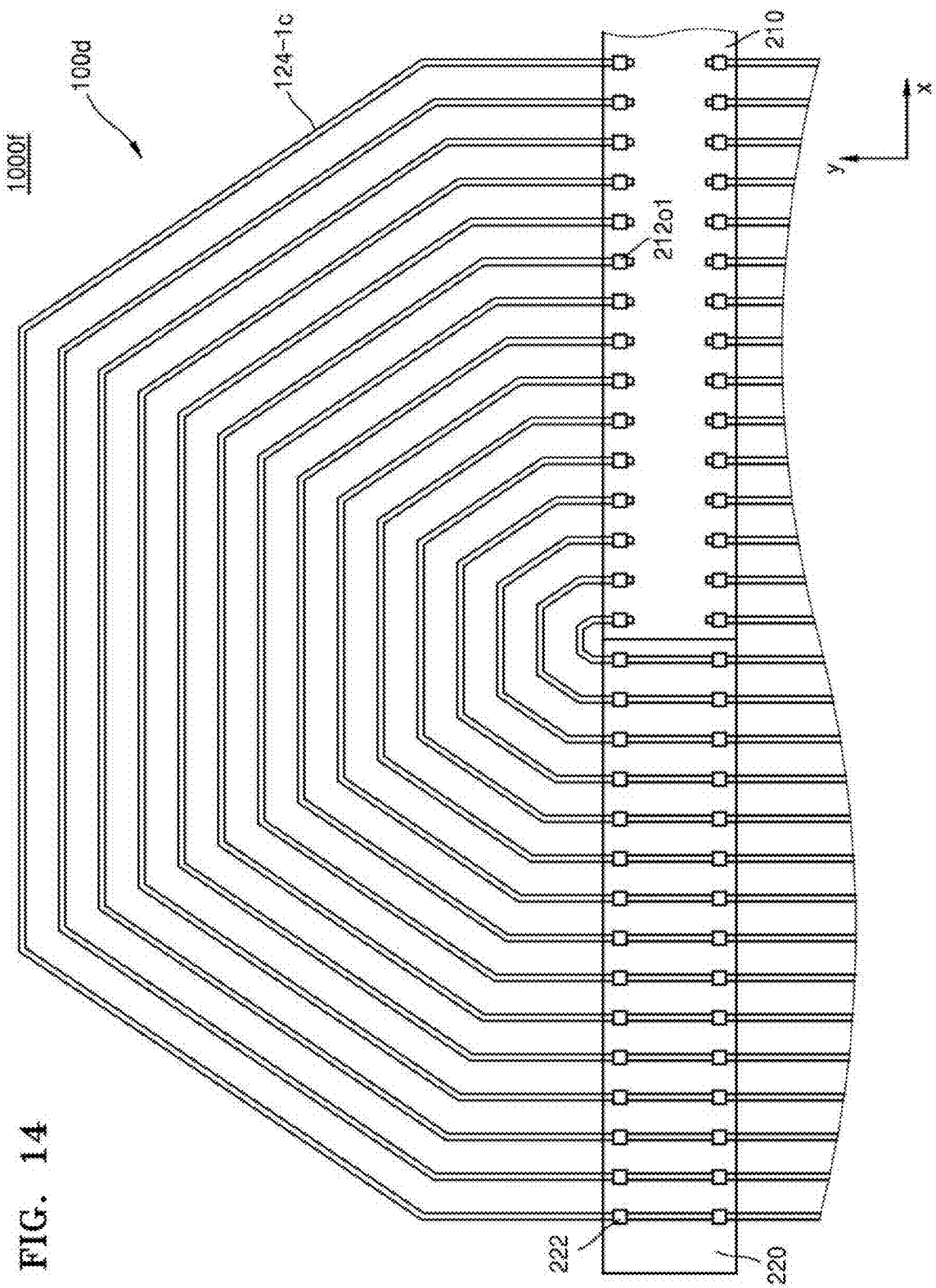

Referring to FIG. 14, in a semiconductor package 1000f according to the present embodiment, the structure of first wiring patterns 124-1c of a tape wiring substrate 100d may be different from the structure of the semiconductor package 1000 of FIG. 1. Specifically, the first wiring patterns 124-1c may start from the first output pads 212o1, be bent four times counterclockwise, and extend downward in the second direction (y direction), as well as extend on the dummy mounting region (112d of FIG. 3). In addition, the first wiring patterns 124-1c disposed on the right side of the semiconductor chip 200 may start from the first output pads 212o1, be bent four times clockwise, and extend downward in the second direction, (y direction) as well as extend on the dummy mounting region 112d. In addition, the second wiring patterns (124-2 of FIG. 1) also may have the same structure as the first wiring patterns 124-1c.

In the semiconductor package 1000f according to an embodiment, the first wiring patterns 124-1c are detoured by bending four times, but are not limited thereto. For example, the first wiring patterns 124-1c may be detoured by bending five times or more in a softer shape. The second wiring patterns 124-2 also may be detoured by bending five times or more.

Figure 15:
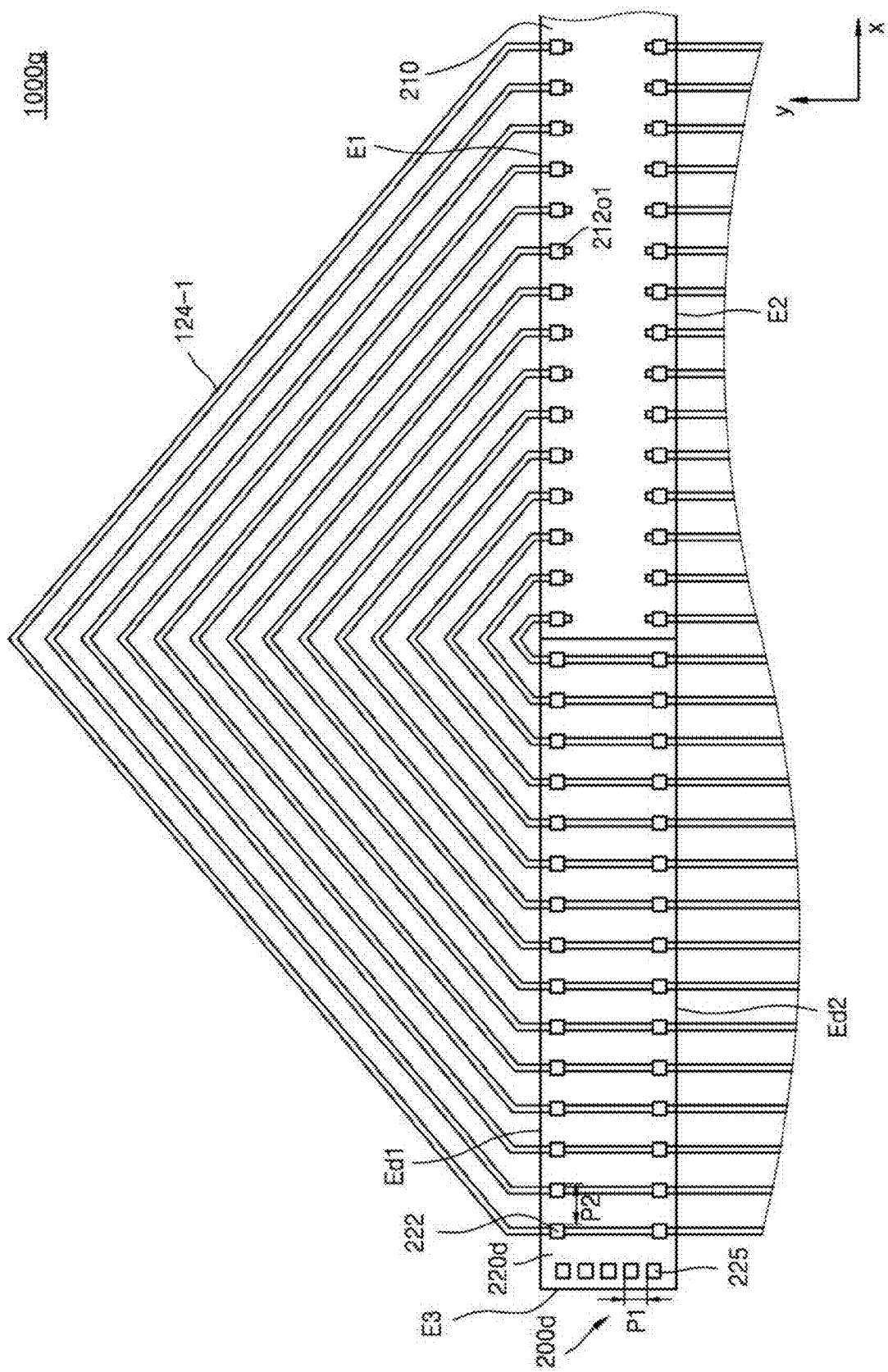

Referring to FIG. 15, in a semiconductor package 1000g according to an embodiment, the arrangement structure of dummy pads 222 and 224 of the dummy chip region 220d may be different from the arrangement structure of the semiconductor package 1000 of FIG. 1. Specifically, in the semiconductor package 1000g according to an embodiment, second dummy pads 225 may be further disposed at the lateral edge E3 of the end portion of the dummy chip region 220d in the second direction (y direction). That is, in the semiconductor package 1000 of FIG. 1, the dummy pads 222 are disposed at only the first dummy long edge (Ed1 of FIG. 2) and the second dummy long edge (Ed2 of FIG. 2) adjacent to the first long edge E1 and the second long edge E2, but in the semiconductor package 1000g according to the present embodiment, the first dummy pads 222 may be disposed along the first dummy long edge Ed1 and the second dummy long edge Ed2 and the second dummy pads 225 may be additionally disposed along the lateral edge E3 of the dummy chip region 220d. In addition, the second dummy pads 225 may be disposed at the lateral edge E3 of the right dummy chip region 220d.

The second dummy pads 225 may not meet the first wiring patterns 124-1. However, in some cases, the second dummy pads 225 may meet the first wiring patterns 124-1. Dummy wiring patterns may be formed on the base film (110 of FIG. 1) while being close to the left and right end portions of the chip mounting section (112 of FIG. 3) where the semiconductor chip 200d is to be mounted. The dummy wiring patterns may function to reduce stress applied to the semiconductor chip 200d. Some of the dummy wiring patterns may be formed to meet the second dummy pads 225.

Since the second dummy pads 225 are disposed at the outer end portion of the semiconductor chip 200d, it is possible to further reinforce the bonding force between the semiconductor chip 200d and the tape wiring substrate (100 of FIG. 1). In particular, it is possible to prevent the bonding force from being weakened at the outer side of the semiconductor chip 200d. In an embodiment, the second dummy pads 225 may have a pitch P1 that is less than or equal to a pitch P2 of the first dummy pads 222.

Figure 16:
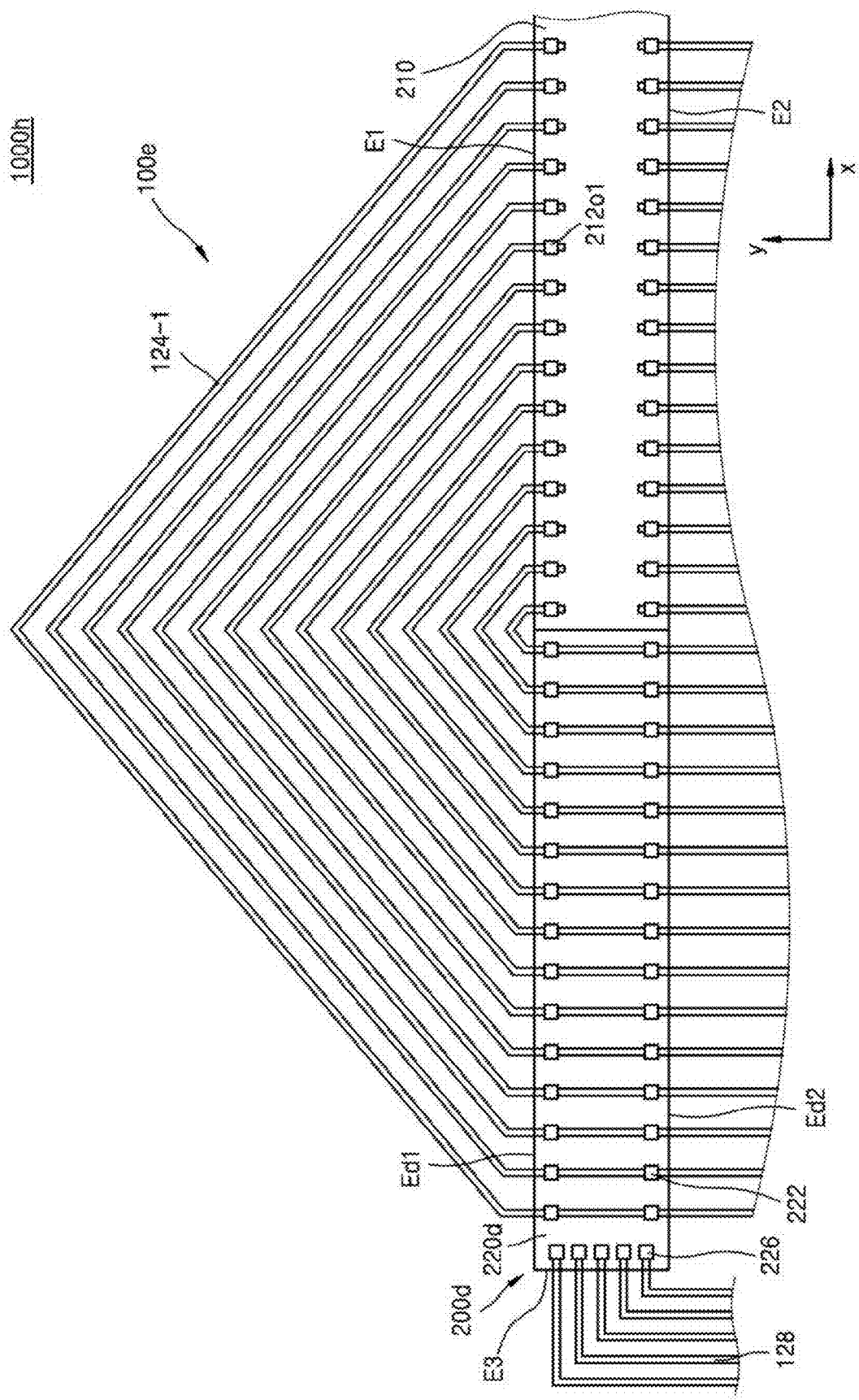

Referring to FIG. 16, in a semiconductor package 1000h according to an embodiment, the arrangement structure of pads 222 and 226 of a dummy chip region 220d may be different from the arrangement structure of the semiconductor package 1000 of FIG. 1. Specifically, in the semiconductor package 1000h according to an embodiment, output pads 226 may be further disposed at the lateral edge E3 of the end portion of the dummy chip region 220d in the second direction (y direction).

In the semiconductor package 1000g of FIG. 15, the second dummy pads 225 are disposed at the lateral edge E3 of the dummy chip region 220d, but in the semiconductor package 1000h according to an embodiment, practically, the output pads 226 may be formed along the lateral edge E3 of the dummy chip region 220d. The output pads 226 may be connected to the ICs of the effective chip region 210 through the chip wirings (not illustrated) formed in the dummy chip region 220d. When the space for the output pads 226 is insufficient at the first long edge E1 of the effective chip region 210 or when the output pads 226 cannot be disposed at the first long edge E1, the output pads 226 may be disposed at the lateral edge E3 of the dummy chip region 220d and the chip wirings may be formed in the dummy chip region 220d, so as to connect to the ICs in the effective chip region 210.

In an embodiment, the output pads 226 formed along the lateral edge E3 of the dummy chip region 220d may be electrically connected to the third output wiring patterns 128 of a tape wiring substrate 100e through connection terminals. The third output wiring patterns 128 may start from the lateral edge E3 of the dummy chip region 220d and extend by bending downward in the second direction (y direction).

In the configuration of the semiconductor package 1000h according to an embodiment, the output pads 226 also are formed along the lateral edge E3. Therefore, as in the semiconductor package 1000g of FIG. 15, it is possible to reinforce the bonding force between the semiconductor chip 200d and the tape wiring substrate 100e and prevent the bonding force from being weakened at the outer side of the semiconductor chip 200d.

Figure 17:
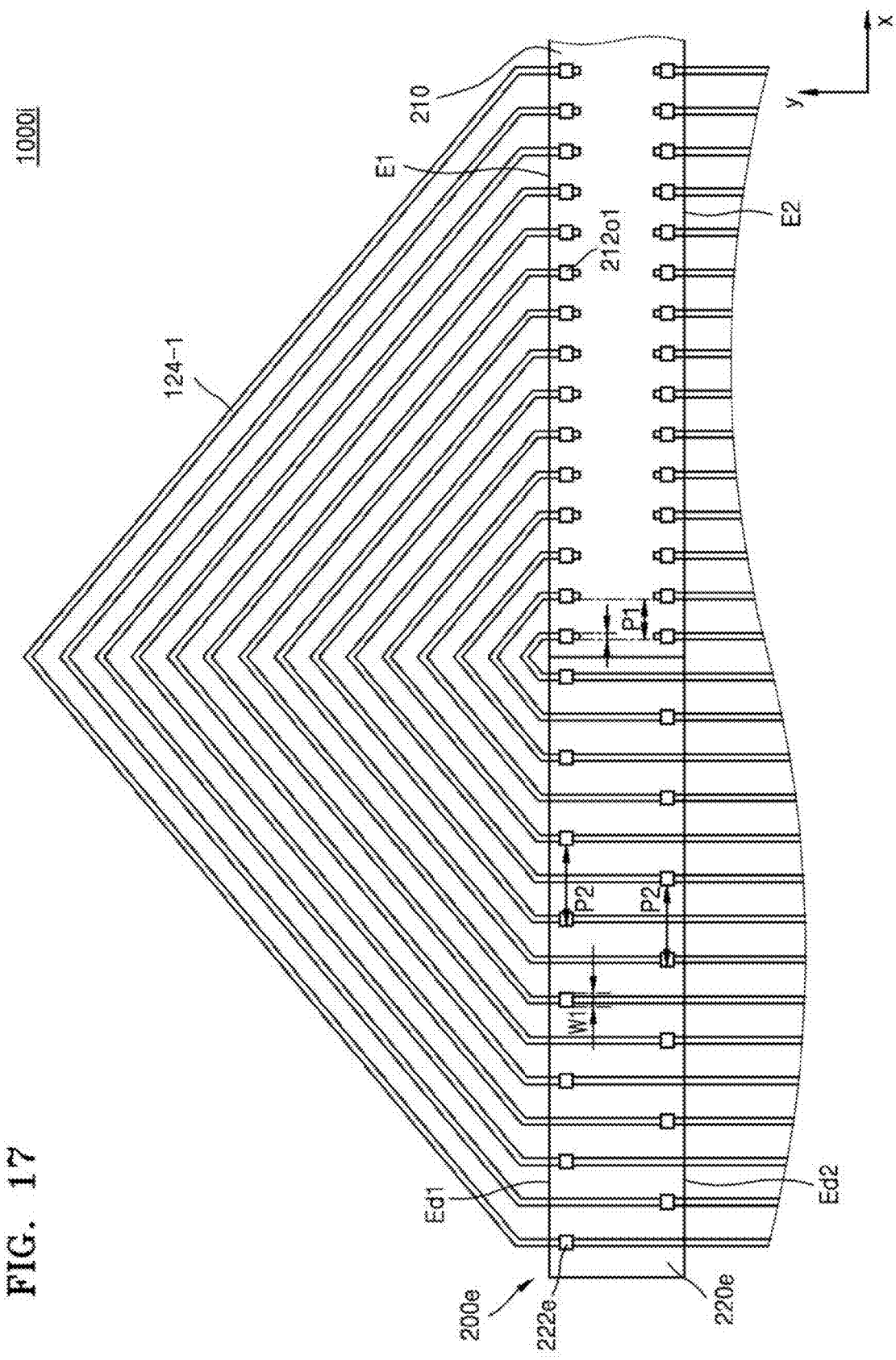

Referring to FIG. 17, in a semiconductor package 1000i according to an embodiment, the arrangement structure of dummy pads 222e of a dummy chip region 220e may be different from the arrangement structure of the semiconductor package 1000 of FIG. 1. Specifically, in the semiconductor package 1000i according to the present embodiment, the dummy pads 222e may have the first width W1 and the second pitch P2. The second pitch P2 may be twice the first pitch P1. In an embodiment, the first output pads 212o1 of the effective chip region 210 may have the first width W1 and the first pitch P1 as in the first semiconductor package 1000 of FIG. 1.

The semiconductor package 1000i according to an embodiment may be similar to the semiconductor package 1000b of FIG. 10 in that the dummy pads 222e have the first width W1 and the second pitch P2. However, the semiconductor package 1000i according to an embodiment may be different from the semiconductor package 1000b of FIG. 10 in that the positions of the dummy pads 222e disposed along the first dummy long edge Ed1 adjacent to the first long edge E1 in the first direction are different from the positions of the dummy pads 222e disposed along the second long edge Ed2 adjacent to the second long edge E2 in the first direction. For example, when considering only the positions of the first direction (x direction), the dummy pads 222e disposed along the first dummy long edge Ed1 and the dummy pads 222e disposed along the second dummy long edge Ed2 may be alternately disposed.

Since the dummy pads 222e are disposed in the above manner, the first wiring patterns 124-1 starting from the first output pads 212o1 and extending on the dummy mounting region (112d of FIG. 3) meet one dummy pad 222e. For example, the first first wiring pattern 124-1 meets the first dummy pad 222e disposed along the first dummy long edge Ed1, and the second first wiring pattern 124-1 meets the first dummy pad 222e disposed along the second dummy long edge Ed2. Therefore, the first wiring patterns 124-1 may alternately meet the dummy pads 222e disposed at the first dummy long edge Ed1 and the dummy pads 222e disposed at the second dummy long edge Ed2.

So far, various arrangement structures of the dummy pads on the dummy chip regions 220, 220a, 220b, 220c, 220d, and 220e and the connection relationships between the dummy pads and the first wiring patterns 124-1, 124-1a, 124-1b, and 124-1c have been described. However, the scope is not limited to the above examples. That is, various other arrangement structures of the dummy pads and various connection relationships between the dummy pads and the first wiring patterns will also fall within the scope.

Figure 18:
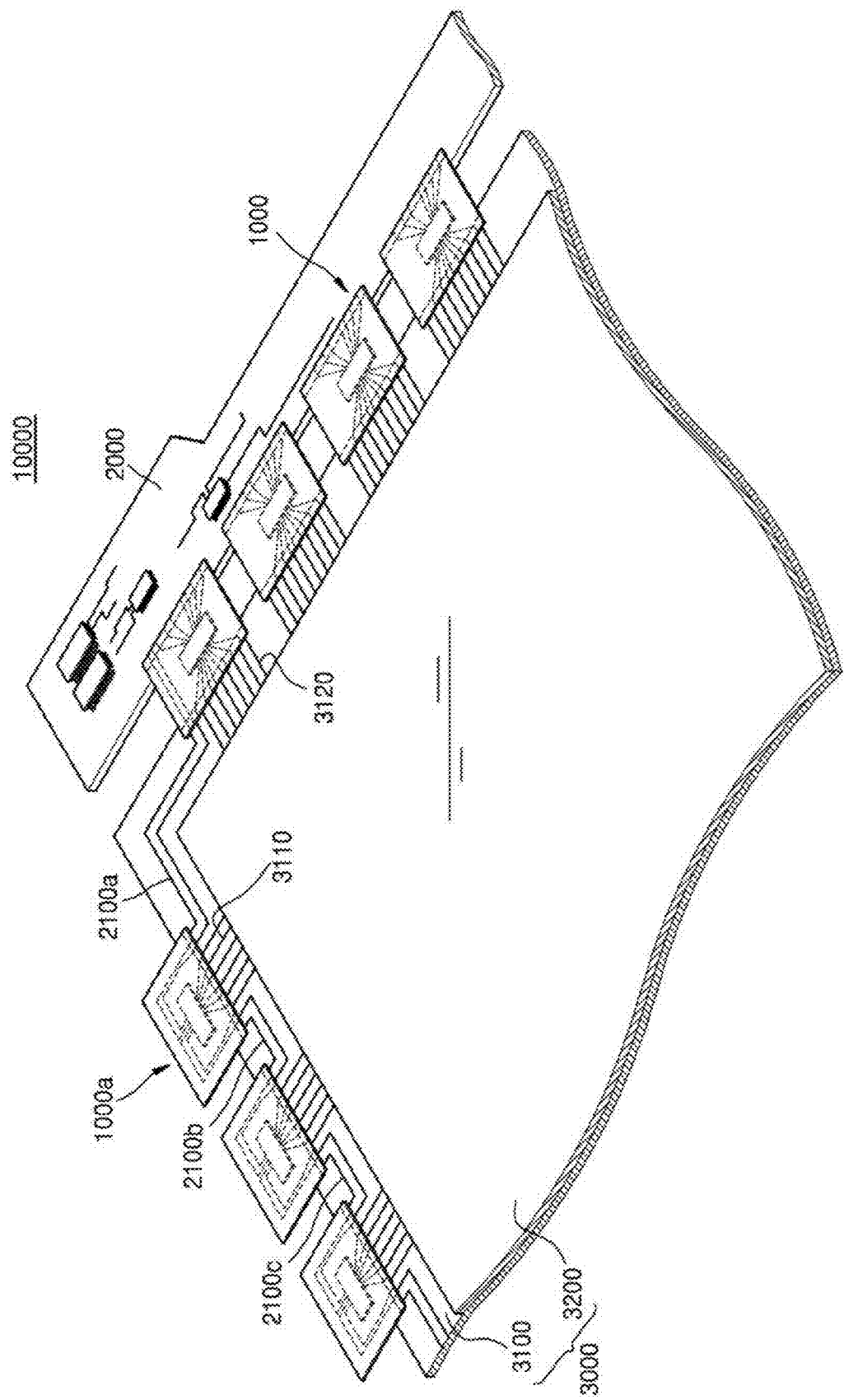
FIG. 18 is a conceptual diagram of a portion of a display apparatus according to an embodiment.

FIG. 18 is a conceptual diagram of a portion of a display apparatus 10000 according to an embodiment. Hereinafter, for convenience, description provided above in association with the semiconductor packages may be omitted for clarity. Referring to FIG. 18, the display apparatus 10000 may include a display panel 3000, a gate chip film package 1000a, a data chip film package 1000, and a PCB 2000.

The display panel 3000 may include a lower substrate 3100 and an upper substrate 3200. The lower substrate 3100 may include gate wirings 3110, data wirings 3120, thin film transistors, and pixel transistors. The upper substrate 3200 may be smaller than the lower substrate 3100 and include a black matrix, a color filter, and a common electrode, which are stacked to face the lower substrate 3100. A liquid crystal layer (not illustrated) may be disposed between the upper substrate 3200 and the lower substrate 3100.

The gate chip film package 1000a may be connected to the gate wirings 3110 formed in the lower substrate 3100, and the data chip film package 1000 may be connected to the data wirings 3120 formed in the lower substrate 3100.

A plurality of driver components may be mounted on the PCB 2000. Since the driver components are semiconductor chips designed by one-chip integration technology, gate driving signals and data driving signals may be simultaneously input to the gate chip film package 1000a and the data chip film package 1000.

In an embodiment, the gate wirings 3110 may be disposed at regular intervals in an effective display region where an actual image is to be displayed. However, in a non-effective display region corresponding to a frame of the lower substrate 3100, the gate wirings 3110 may be disposed at narrow intervals to form a series of groups, so as to facilitate the connection to the gate chip film package 1000a. Similarly, the data wirings 3120 are disposed at regular intervals in the effective display region where an actual image is to be displayed. However, in the non-effective display region corresponding to the frame of the lower substrate 3100, the data wirings 3120 may be disposed at narrow intervals, so as to facilitate the connection to the data chip film package 1000.

The gate chip film package 1000a may function to transfer the gate driving signals output from the PCB 2000 to the thin film transistors of the lower substrate 3100. The gate chip film package 1000a may have the various semiconductor package structures described above with reference to FIGS. 1 to 17.

The data chip film package 1000 may be divided into a first data chip film package and a second data chip film package. The first data chip film package may provide the gate driving signals and the data driving signals, and the second data chip film package may provide the data driving signals. The first data chip film package and the second data chip film package may have the various semiconductor package structures described above with reference to FIGS. 1 to 17.

The first data chip film package may include wiring patterns formed on the base film, and a data driving semiconductor chip electrically connected to the wiring patterns. In an embodiment, some of the wiring patterns may be connected to first gate driving signal transmission lines of the lower substrate 3100 but not be connected to the data driving semiconductor chip and transfer the gate driving signals output from the PCB 2000 to the gate chip film package 1000a. The other wiring patterns may be connected to the data wirings 1320 of the lower substrate 3100 and connected to the data driving semiconductor chip and transfer the data driving signals output from the PCB 2000 to the thin film transistors of the lower substrate 3100.

In addition, as in the first data chip film package, the second data chip film package adjacent to the first data chip film package may include wiring patterns formed on the base film, and a data driving semiconductor chip electrically connected to the wiring patterns. The second data chip film package may function to transfer the data driving signals output from the PCB 2000 to the thin film transistors of the lower substrate 3100.

First gate driving signal transmission lines 2100a may be disposed at the edge of the lower substrate 3100 between the gate chip film package 1000a and the first data chip film package, which are adjacent to each other at the shortest distance. One end of the first gate driving signal transmission line 2100a may extend toward the data wiring 3120, and the other end of the first gate driving signal transmission line 2100a may extend toward the gate wiring 3110.

Another gate driving signal transmission line, which is separate from the first gate driving signal transmission line 2100a, may be further provided between the respective groups of the gate wirings 3110. For example, second and third gate driving signal transmission lines 2100b and 2100c may be further disposed.

In the configuration of the display apparatus 10000, signal supply from the PCB 2000 to the display panel 3000 may be performed as follows:

When an image signal output from an external information processing apparatus, for example, a computer main body, is input to the PCB 2000, the PCB 2000 may generate a gate driving signal and a data driving signal corresponding to the input image. The data driving signal generated by the PCB 2000 may be input to the data driving semiconductor chip through the wiring pattern of the data chip film package 1000. Then, the data driving signal processed by the data driving semiconductor chip may be input to the data wiring 3120 of the lower substrate 3100 through the wiring patterns of the first and second data chip film packages.

Simultaneously, the gate driving signal generated by the PCB 2000 may be input to the first gate driving transmission line of the lower substrate 3100 through some of the wiring patterns of the first data chip film package. The gate driving signal input through the first gate driving signal transmission line 2100a may be input to the gate driving semiconductor chip through the wiring pattern of the gate chip film package 1000a. Then, the gate driving signal processed by the gate driving semiconductor chip may be input to the gate wiring 3110 of the lower substrate 3100 through the wiring pattern of the gate chip film package 1000a.

In addition, some of the gate driving signals input through the first gate driving signal transmission lines 2100a may be transferred to the adjacent gate chip film package 1000a through the second gate driving signal transmission lines, without being processed by the gate driving semiconductor chip. In this manner, when a gate output signal is applied to the gate wiring 3110 of the lower substrate 3100, all the thin film transistors of one row may be turned on in response to the gate output signal, and a voltage applied to the data driving semiconductor chip may be rapidly output to the pixel electrode by the turned-on thin film transistors. As a result, an electric field may be formed between the pixel electrode and the common electrode. The formation of the electric field changes the alignment of the liquid crystal disposed between the upper substrate 3200 and the lower substrate 3100, and thus, image information may be displayed to the outside.

Figure 19:
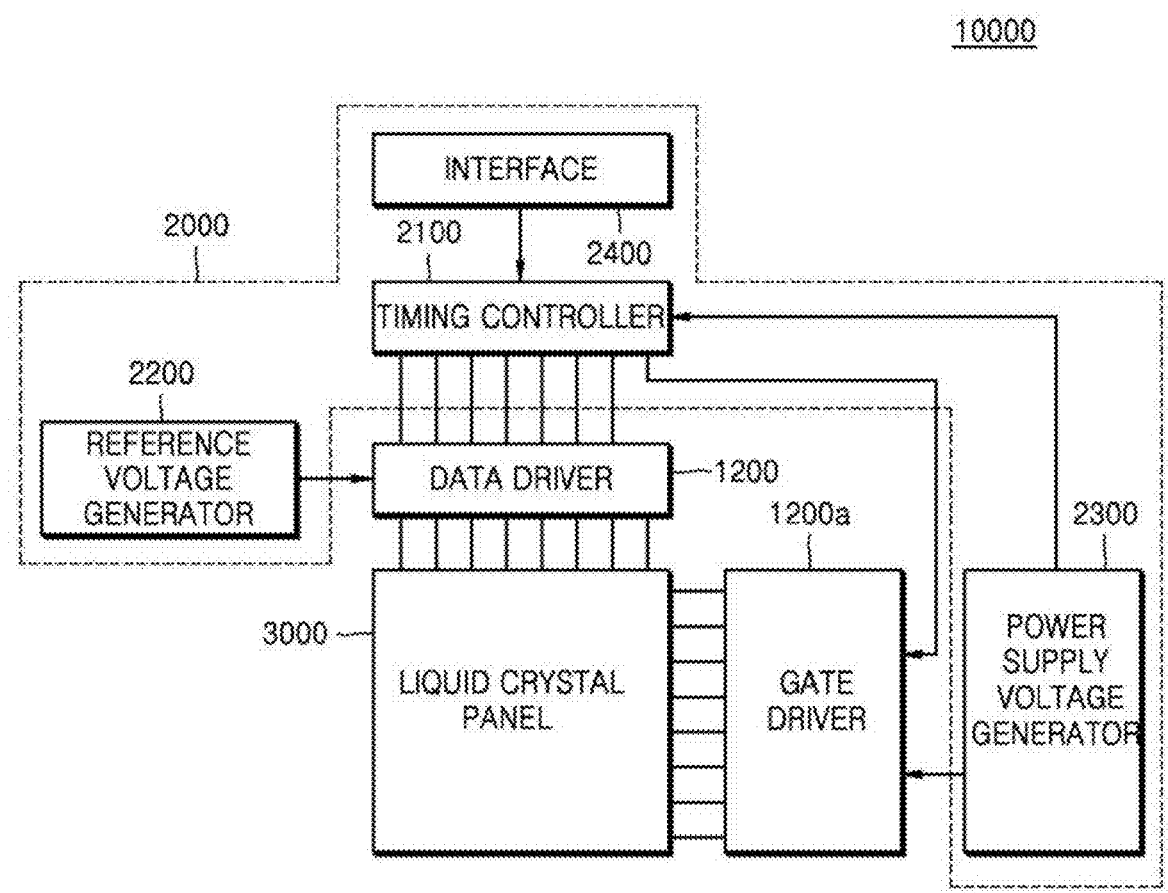
FIG. 19 is a configuration diagram of the display apparatus of FIG. 18.

FIG. 19 is a configuration diagram of the display apparatus 10000 of FIG. 18. Referring to FIG. 19, the semiconductor chips 200, 200a, 200b, 200c, 200d, and 200e of the various semiconductor package structures may correspond to a data driver 1200 and/or a gate driver 1200a of the display apparatus 10000. The data driver 1200 may process a data signal output from a timing controller 2100. The gate driver 1200a may process a scan signal output from the timing controller 2100.

The timing controller 2100, a reference voltage generator 2200, a power supply voltage generator 2300, and an interface 2400 may be mounted on a PCB 2000. The timing controller 2100 may generate the data signal, the scan signal, and a control signal. The reference voltage generator 2200 may generate a reference voltage that allows the data driver 1200 to generate color signals or image signals corresponding to the data signals. The data signals may be temporarily stored or latched in the data driver 1200 by the control signal. Then, the color signals or the image signals may be output to the data wirings of the display panel 3000 in synchronization with the scan signals output from the gate driver 1200*a*. The gate driver 1200*a* may sequentially output the scan signals to the gate wirings of the display panel 3000. The power supply voltage generator 2300 may generate a power supply voltage to be applied to the timing controller 2100 and the gate driver 1200*a*. The power supply voltage and the reference voltage may differ.

In an embodiment, the tape wiring substrate (100 of FIG. 1) may be electrically connected between the PCB 2000 and the display panel 3000. Semiconductor chips corresponding to the data driver 1200 and/or the gate driver 1200*a* are mounted on the tape wiring substrate 100. In this manner, the semiconductor packages as described above with reference to FIGS. 1 to 17 may be implemented. The input wiring patterns (122 of FIG. 1) of the tape wiring substrate 100 may be electrically connected to the substrate pads of the PCB 2000 through the connection terminals, such as the bumps or solder balls. In addition, the output wiring patterns (124 and 126 of FIG. 1) of the tape wiring substrate 100 may be electrically connected to the panel pads of the display panel 3000 through the connection terminals.

Figure 20:
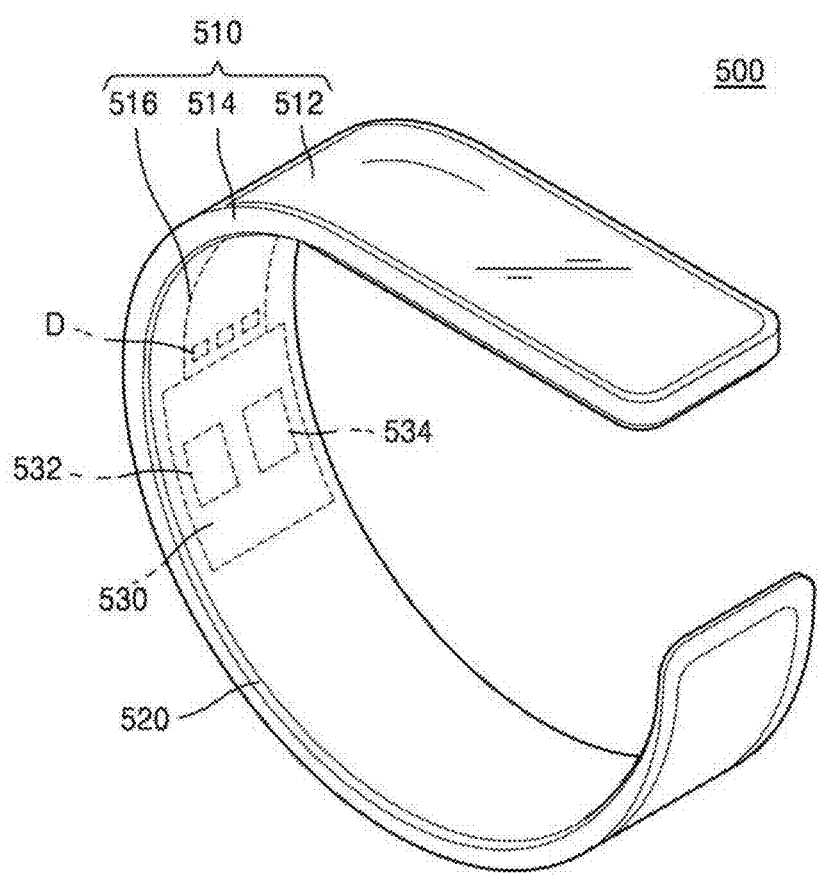
FIG. 20 is a perspective view of a wearable electronic device according to an embodiment.

FIG. 20 is a perspective view of a wearable electronic device 500 according to an embodiment. Referring to FIG. 20, the wearable electronic device 500 according to an embodiment may include a display panel section 510, a wearing section 520, and a PCB 530.

The display panel section 510 may include a display panel 512, a panel body 514, and a driver circuit package 516. For easy wear, the entire display panel section 510 may be made of a flexible material. For example, the display panel 512 may be made of a flexible material. The display panel section 510 may be implemented such that the display panel 512 is housed in the panel body 514 made of a flexible plastic.

The driver circuit package 516 may include driving element chips D configured to drive the display panel 512. The driver circuit package 516 may transfer data signals by connecting the display panel section 510 and an image signal processor 532 of the PCB 530. The driver circuit package 516 may be the semiconductor packages described above with reference to FIGS. 1 to 17, and the driving element chips D may be the semiconductor chips 200, 200*a*, 200*b*, 200*c*, 200*d*, and 200*e*. In addition, the driving element chips D may be mounted on the flexible tape wiring substrates 100, 100*a*, 100*c*, 100*d*, and 100*e*. One end of the driver circuit package 516 may be connected to the display panel 512, and the other end of the driver circuit package 516 may be connected to the image signal processor 532.

In an embodiment, if the PCB 530 is disposed within the wearing section 520, all or part of the driver circuit package 516 may be disposed within the wearing section 520 for connection to the image signal processor 532.

The wearing section 520 may be connected to one end of the display panel section 510 and have a curved band shape. The wearing section 520 is provided to allow a user to wear the display panel section 510 on a wrist. The wearing section 520 may be made of a flexible material for comfortable wear, regardless of the size of the wrist.

In the wearable electronic device 500 according to an embodiment, the wearing section 520 is connected to one end of the display panel section 510, but the wearing section 520 may be connected to both ends of the display panel section 510.

In an embodiment, the image signal processor 532 may process the image signals under the control of a controller 534 and provide the processed image signals to the display panel section 510. The image signal processor 532 may be implemented on the single PCB 530 together with the controller 534. For example, the image signal processor 532 and the controller 534 may be semiconductor chips, and the semiconductor chips may be mounted on the PCB 530.

The controller 534 may include a communication module and a control module. The communication module may support various communication protocols so as to enable communication with various networks around the wearable electronic device 500 according to an embodiment.

All the components of the wearable electronic device 500 according to the present embodiment may be flexible. Basically, the wearable electronic device 500 according to an embodiment may include the semiconductor packages exemplified with reference to FIGS. 1 to 17. On the other hand, the wearable electronic device 500 according to an embodiment may include other output devices besides a display panel. Examples of the output device may include a lamp or an alarm.

In addition, the wearable electronic device 500 according to an embodiment may include no output device. Various wearable electronic devices may be implemented. For example, a wearable electronic device may include a sensor that senses signals related to health, a signal processor that stores the sensed signals and calculates values from the sensed signals, a connection section that transfers signals by connecting the sensor and the signal processor through a flexible semiconductor package structure exemplified in FIGS. 1 to 17.

An embodiment provides a semiconductor package using a tape wiring substrate. In particular, an embodiment provides a tape wiring substrate that includes wiring patterns capable of minimizing an increase in the size of the tape wiring substrate while applying the tape wiring substrate to a semiconductor chip, the width of which is increased by an addition of a dummy chip region. In addition, an embodiment provides a semiconductor package including the tape wiring substrate, and a display apparatus including the semiconductor package.

According to an aspect of an embodiment, a tape wiring substrate including: a base film includes a chip mounting section on which a semiconductor chip is to be mounted; and a plurality of wiring patterns provided on the base film, wherein some of the wiring patterns extend on a portion of the chip mounting section.

The semiconductor chip may include an effective chip region at a center of the semiconductor chip and in which pads connected to chip wirings are formed, and a dummy chip region at both sides of the effective chip region and in which pads not connected to the chip wirings are formed, the chip mounting section may be divided into an effective mounting region corresponding to the effective chip region, and a dummy mounting region corresponding to the dummy chip region, and some of the wiring patterns may extend on the dummy mounting region.

The effective chip region may have a rectangular shape extending in a first direction. Input pads may be disposed in the first direction at a center of a first long edge of two long edges of the rectangle. Output pads may be disposed in the first direction at both sides of the first long edge. Wiring patterns, which are connected to the output pads, may start upward in a second direction of the first long edge and extend downward in a second direction of a second long edge of the two long edges of the rectangle while turning toward the outside. Wiring patterns, which are disposed at the outside among the wiring patterns and connected to outer output pads disposed at the outside among the output pads, may extend on the dummy mounting region and extend downward in the second direction.

According to another aspect of an embodiment, a semiconductor package includes: a semiconductor chip including an effective chip region at a center of the semiconductor chip and in which pads connected to chip wirings are formed, and a dummy chip region at a side of the effective chip region and in which pads not connected to the chip wirings are formed; a base film including a chip mounting section on which the semiconductor chip is to be mounted; and a plurality of wiring patterns provided on the base film and electrically connected to the chip wirings of the semiconductor chip, wherein first wiring patterns, which are a part of the wiring patterns, extend on a first region of the chip mounting section at a lower portion of the dummy chip region.

The semiconductor chip may be mounted on the chip mounting section through terminals disposed on the pads, the terminals including effective terminals provided on the pads of the effective chip region and dummy terminals provided on the pads of the dummy chip region. The pads of the effective chip region may be electrically connected to the wiring patterns through the effective terminals. The first wiring patterns may start from the effective terminals and extend on the first region. At least some of the dummy terminals may be connected to the first wiring patterns in the first region.

In an embodiment, all the dummy terminals may be connected to the first wiring patterns, respectively.

A spacing of the dummy terminals may be larger than a spacing of the effective terminals, and some of the first wiring patterns may pass between the dummy terminals.

The dummy terminals may include first dummy terminals having a large spacing and second dummy terminals having a small spacing, and some of the first wiring patterns may pass between the first dummy terminals.

The effective chip region may have a rectangular shape extending in a first direction. Input pads may be disposed in the first direction at a center of a first long edge of two long edges of the rectangle. First output pads may be disposed in the first direction at both sides of the first long edge. Second output pads may be disposed in the first direction at both sides of a second long edge of the two long edges of the rectangle. The dummy chip region may be on both sides of the effective chip region and has a rectangular shape having a same width as the rectangle. Dummy pads may be disposed in the first direction in a first edge adjacent to the first long edge and a second edge region adjacent to the second long edge.

The semiconductor chip may be mounted on the chip mounting section through terminals disposed on the pads, the terminals including effective terminals provided on the input pads, the first output pads and the second output pads of the effective chip region, and dummy terminals provided on the dummy pads of the dummy chip region. First output wiring patterns, which are electrically connected to the first output pads, among the wiring patterns, may start upward in a second direction of the first long edge and extend downward in a second direction of a second long edge while turning toward the outside. The first wiring patterns, which constitute some of the first output wiring patterns, may be electrically connected to outer output pads disposed at the outside among the first output pads, extend on the first region, and extend downward in the second direction.

Input wiring patterns, which are connected to the input pads, among the wiring patterns, may extend upward in the second direction of the first long edge. Second output wiring patterns, which are connected to the second output pads, among the wiring patterns, may extend downward in the second direction of the second long edge. The first output wiring patterns, except for the first wiring patterns, may extend on an outer portion of the chip mounting section and extend downward in the second direction.

The semiconductor chip may be mounted on the chip mounting section through terminals disposed on the pads, the terminals including effective terminals provided on the input pads, the first output pads and the second output pads of the effective chip region, and the dummy terminals provided on the dummy pads of the dummy chip region. The input pads, the first output pads, and the second output pads may be electrically connected to the wiring patterns through the effective terminals. The first wiring patterns may be connected to some of the effective terminals corresponding to the first output pads, start upward in the second direction of the first long edge, and extend on the first region while turning toward the outside. At least some of the dummy terminals may be connected to the first wiring patterns in the first region.

A spacing of the first wiring patterns may be constant in the first region. The dummy terminals may be disposed with least two kinds of spacing. Some of the first wiring patterns may be connected to the dummy terminals and others pass between the dummy terminals.

Each of the first wiring patterns may be connected to one of the effective terminals and at least one of the dummy terminals.

First dummy pads disposed at the first edge and second dummy pads disposed at the second edge among the dummy pads may be disposed at a same spacing and same positions in the first direction. First dummy terminals among the dummy terminals may be provided on the first dummy pads, and second dummy terminals among the dummy terminals may be provided on the second dummy pads. Each of the first wiring patterns may be connected to one of the effective terminals, one of the first dummy terminals, and one of the second dummy terminals disposed at a same position as the one of the first dummy terminals in the first direction.

Additional dummy pads may be disposed at both lateral edges of the dummy chip region in a second direction perpendicular to the first direction, and additional dummy terminals may be provided on the additional dummy pads.

According to another aspect of an embodiment, a semiconductor package includes: a semiconductor chip including an effective chip region in which effective pads connected to chip wirings are formed, and a dummy chip region at both sides of the effective chip region and in which pads not connected to the chip wirings are formed; a base film on which the semiconductor chip is mounted, the base film including a chip mounting section having an effective mounting region corresponding to the effective chip region and a dummy mounting region corresponding to the dummy chip region, a wiring section disposed at an outside of the chip mounting section, a perforation section which is on both sides of the wiring section and in which perforation holes are formed at regular intervals, and a bonding section that is bonded to an external device; and a plurality of wiring patterns electrically connected to the chip wirings of the semiconductor chip and wirings of the external device and formed in the dummy mounting region and the wiring section.

First wiring patterns, which are a part of the wiring patterns, may start from one edge of the effective mounting region, extend on the dummy mounting region while turning clockwise or counterclockwise toward the perforation section, and extend in a direction of the bonding section.

The semiconductor chip may be mounted on the chip mounting section through terminals disposed on the pads, the terminals including effective terminals provided on the effective pads and dummy terminals provided on the dummy pads, and each of the first wiring patterns may be connected to one of the effective terminals and at least one of the dummy terminals.

The external device may include a display panel or a wearable output device, and powers and data signals may be applied to the external device through the bonding section.

According to another aspect of an embodiment, there is provided a display apparatus including: a display panel that displays an image; a printed circuit board that supplies driving signals for driving the display panel to display the image; and a flexible semiconductor package which is connected between the printed circuit board and the display panel and on which a semiconductor chip is mounted, wherein the semiconductor package includes the semiconductor chip with a heat dissipation region, a base film with a chip mounting section on which the semiconductor chip is mounted, and a plurality of wiring patterns formed on the base film and electrically connected to the semiconductor chip, and first wiring patterns, which are a part of the wiring patterns, extend on the chip mounting section overlapping the heat dissipation region.

An embodiment includes a semiconductor package including: a semiconductor chip including an effective chip region at a center of the semiconductor chip and in which pads connected to chip wirings are formed, and a dummy chip region at a side of the effective chip region and in which pads not connected to the chip wirings are formed; a base film including a chip mounting section on which the semiconductor chip is to be mounted; and a plurality of wiring patterns provided on the base film and electrically connected to the chip wiring patterns of the semiconductor chip. First wiring patterns, which are a part of the plurality of wiring patterns, extend on a first region of the chip mounting section at a lower portion of the dummy chip region.

While embodiments have been particularly shown and described with reference the drawings, it will be understood that various changes in form and details may be made therein without departing from the spirit and scope of the following claims.

What is claimed is:

1. A tape wiring substrate comprising:
a base film including a chip mounting section on which a semiconductor chip is to be mounted; and
a plurality of wiring patterns provided on the base film and disposed within a boundary of the base film,
wherein some of the plurality of wiring patterns each includes a first part and a second part,
wherein the first part extends from a part of the chip mounting section through an outside of the chip mounting section of the base film to another part of the chip mounting section,
wherein the chip mounting section includes an effective mounting region corresponding to an effective chip region of the semiconductor chip, and a dummy mounting region corresponding to a dummy chip region of the semiconductor chip, and, and
wherein the second part extends on the dummy mounting region and passes through the dummy mounting region.

2. The tape wiring substrate of claim 1,
wherein the semiconductor chip includes pads, chip wirings and the effective chip region at a center of the semiconductor chip,
wherein the pads are connected to the chip wirings, wherein the semiconductor chip further includes dummy pads and the dummy chip region at both sides of the effective chip region,
wherein dummy pads are not connected to the chip wirings.

3. The tape wiring substrate of claim 2,
wherein the effective chip region has a rectangular shape extending in a first direction,
wherein the pads include input pads disposed along the first direction at a center of a first long edge of the rectangular shape of the effective chip region,
wherein the pads further include output pads disposed along the first direction along both sides of the first long edge,
wherein the some of the plurality of wiring patterns include first wiring patterns connected to the output pads, extending away from the effective mounting region and then extending around the chip mounting section, and
wherein the some of the plurality of wiring patterns further include second wiring patterns connected to the output pads, extending away from the effective mounting region and then extending through the dummy mounting region.

4. A semiconductor package comprising:
a semiconductor chip including chip wirings, an effective chip region at a center of the semiconductor chip and in which pads connected to the chip wirings are formed, and a dummy chip region at a side of the effective chip region and in which pads not connected to the chip wirings are formed;
a base film including a chip mounting section on which the semiconductor chip is mounted,
wherein the chip mounting section of the base film includes a dummy mounting region corresponding to the dummy chip region and an effective mounting region corresponding to the effective chip region, and
wherein the chip mounting section includes a first edge and a second edge opposite to the first edge of the chip mounting section; and
a plurality of wiring patterns disposed on the base film and electrically connected to the chip wirings of the semiconductor chip,
wherein the plurality of wiring patterns includes a plurality of first wiring patterns,
wherein each of the plurality of first wiring patterns includes a first part and a second part,
the first part extending from a first edge of the effective mounting region through an outside of the chip mounting section of the base film to a first edge of the dummy mounting region, and
the second part extending from the first edge of the dummy mounting region through the dummy mounting region to a second edge of the dummy mounting region,
wherein the first edge of the dummy mounting region and the first edge of the effective mounting region are part of the first edge of the chip mounting section, and
wherein the second edge of the dummy mounting region is part of the second edge of the chip mounting section.

5. The semiconductor package of claim 4, further comprising:
terminals,
wherein the semiconductor chip is mounted on the chip mounting section of the base film through the terminals disposed on the pads of the semiconductor chip,
wherein the terminals includes effective terminals provided on the pads of the effective chip region and dummy terminals provided on the pads of the dummy chip region,
wherein the pads of the effective chip region are electrically connected to the wiring patterns through the effective terminals, and
wherein at least one of the plurality of first wiring patterns is electrically connected to at least one of the effective terminals and at least one of the dummy terminals.

6. The semiconductor package of claim 5,
wherein each of the dummy terminals is connected to one of the plurality of first wiring patterns.

7. The semiconductor package of claim 5,
wherein a spacing of the dummy terminals is larger than a spacing of the effective terminals, and
wherein some of the plurality of first wiring patterns pass between the dummy terminals.

8. The semiconductor package of claim 5,
wherein the dummy terminals include first dummy terminals having a large spacing and second dummy terminals having a small spacing, and
wherein some of the plurality of first wiring patterns pass between the first dummy terminals.

9. The semiconductor package of claim 4,
wherein the effective chip region of the semiconductor chip has a rectangular shape extending in a first direction,
wherein the semiconductor chip further includes input pads disposed in the first direction at a center of a first long edge of the rectangular shape of the effective chip region, first output pads disposed along the first direction along both sides of the first long edge, and second output pads disposed along the first direction along both sides of a second long edge of the rectangular shape of the effective chip region,
wherein the dummy chip region of the semiconductor chip is disposed on both sides of the effective chip region and has a rectangular shape having a same width as the rectangular shape of the effective chip region, and
wherein the dummy chip region includes dummy pads disposed along the first direction along a first edge of the dummy chip region adjacent to the first long edge and along a second edge of the dummy chip region adjacent to the second long edge.

10. The semiconductor package of claim 9, further comprising:
terminals,
wherein the semiconductor chip is mounted on the chip mounting section of the base film through the terminals disposed on the input pads, the first output pads, the second output pads and dummy pads of the semiconductor chip,
wherein the terminals includes effective terminals provided on the input pads, the first output pads and the second output pads of the effective chip region, and dummy terminals provided on the dummy pads of the dummy chip region,
wherein the plurality of first wiring patterns includes first output wiring patterns electrically connected to the first output pads, the first output wiring patterns extending away from the effective mounting region and then extending towards the dummy mounting region, and
wherein the first output wiring patterns are electrically connected to outer output pads of the first output pads and extend on the dummy mounting region.

11. The semiconductor package of claim 10,
wherein the plurality of wiring patterns further includes input wiring patterns connected to the input pads, the input wiring patterns extending away from the effective chip region, and
wherein the plurality of wiring patterns further includes second output wiring patterns connected to the second output pads, extending away from the effective chip region in a direction opposite an extending direction of the input wiring patterns.

12. The semiconductor package of claim 9, further comprising:
terminals,
wherein the semiconductor chip is mounted on the chip mounting section of the base film through the terminals disposed on the input pads, the first output pads, the second output pads and dummy pads of the semiconductor chip,
wherein the terminals include effective terminals provided on the input pads, the first output pads and the second output pads of the effective chip region, and dummy terminals provided on the dummy pads of the dummy chip region,
wherein the input pads, the first output pads, and the second output pads are electrically connected to the wiring patterns through the effective terminals, and
wherein at least one of the plurality of first wiring patterns is electrically connected at least one of the effective terminals and at least one of the dummy terminals.

13. The semiconductor package of claim 12,
wherein a spacing of the plurality of first wiring patterns is constant in the dummy mounting region,
wherein the dummy terminals are disposed with at least two kinds of a spacing, and
wherein some of the first wiring patterns are connected to the dummy terminals and others pass between the dummy terminals.

14. The semiconductor package of claim 12,
wherein each of the plurality of first wiring patterns is connected to one of the effective terminals and at least one of the dummy terminals.

15. The semiconductor package of claim 14,
wherein dummy pads include first dummy pads disposed along the first edge of the dummy chip region and second dummy pads disposed along the second edge of the dummy chip region,
wherein the first dummy pads and the second dummy pads are disposed at a same spacing and same positions in the first direction,
wherein the dummy terminals include first dummy terminals disposed on the first dummy pads, and second dummy terminals disposed on the second dummy pads,
wherein each of the plurality of first wiring patterns is connected to a corresponding one of the first dummy terminals and a corresponding one of the second dummy terminals, and
wherein the corresponding one of the first dummy terminals and the corresponding one of the second dummy terminals are disposed at a same position along the first direction.

16. The semiconductor package of claim 12,
wherein the dummy pads further include additional dummy pads disposed at both lateral edges of the dummy chip region in a second direction perpendicular to the first direction, and
wherein the dummy terminals further include additional dummy terminals provided on the additional dummy pads.

17. A semiconductor package comprising:
a semiconductor chip including chip wirings, an effective chip region in which effective pads connected to chip wirings are formed, and a dummy chip region at both sides of the effective chip region and in which dummy pads not connected to the chip wirings are formed;
a base film on which the semiconductor chip is mounted, the base film including:
 a chip mounting section having an effective mounting region corresponding to the effective chip region and a dummy mounting region corresponding to the dummy chip region,
 a wiring section disposed at an outside of the chip mounting section, wherein the wiring section surrounds the chip mounting section,
 a perforation section including perforation holes formed at regular intervals, wherein part of the wiring section is interposed between the perforation section and the chip mounting section, and
 a bonding section bonded to an external device; and
a plurality of wiring patterns electrically connected to the chip wirings of the semiconductor chip and wirings of the external device,
wherein the plurality of wiring patterns is formed in the dummy mounting region and the wiring section, and
at least one of the plurality of wiring patterns extends on the dummy mounting region and passes through the dummy mounting region.

18. The semiconductor package of claim 17,
wherein the plurality of wiring patterns includes first wiring patterns extending away from the effective mounting region, then extending on the dummy mounting region, and then extending towards the bonding section.

19. The semiconductor package of claim 18, further comprising:
terminals,
wherein the semiconductor chip is mounted on the chip mounting section through the terminals disposed on the effective pads and the dummy pads,
wherein the terminals include effective terminals provided on the effective pads and dummy terminals provided on the dummy pads, and
wherein each of the first wiring patterns is connected to one of the effective terminals and at least one of the dummy terminals.

20. The semiconductor package of claim 17, wherein:
the external device includes a display panel or a wearable output device, and
the external device is configured to receive power and data signals through the bonding section.

* * * * *